US012586619B2

(12) United States Patent
Young et al.

(10) Patent No.: US 12,586,619 B2
(45) Date of Patent: *Mar. 24, 2026

(54) INTEGRATED CIRCUIT DEVICE AND METHODS

(71) Applicant: TAIWAN SEMICONDUCTOR MANUFACTURING COMPANY, LTD., Hsinchu (TW)

(72) Inventors: Bo-Feng Young, Hsinchu (TW); Yu-Ming Lin, Hsinchu (TW); Shih-Lien Linus Lu, Hsinchu (TW); Han-Jong Chia, Hsinchu (TW); Sai-Hooi Yeong, Hsinchu (TW); Chia-En Huang, Hsinchu (TW); Yih Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 120 days.

This patent is subject to a terminal disclaimer.

(21) Appl. No.: 18/421,683

(22) Filed: Jan. 24, 2024

(65) Prior Publication Data

US 2024/0161797 A1    May 16, 2024

Related U.S. Application Data

(63) Continuation of application No. 17/815,113, filed on Jul. 26, 2022, now Pat. No. 11,915,787, which is a
(Continued)

(51) Int. Cl.
| | |
|---|---|
| *G11C 7/12* | (2006.01) |
| *G06F 30/39* | (2020.01) |
| *G11C 8/08* | (2006.01) |

(52) U.S. Cl.
CPC ............... *G11C 7/12* (2013.01); *G06F 30/39* (2020.01); *G11C 8/08* (2013.01)

(58) Field of Classification Search
CPC ......... G11C 7/12; G11C 8/08; G11C 11/1659; G11C 13/0002; G11C 13/0026;
(Continued)

(56) References Cited

U.S. PATENT DOCUMENTS 7,260,442 B2    8/2007  Hwang et al.
9,053,781 B2    6/2015  Tsai et al.
(Continued)

FOREIGN PATENT DOCUMENTS

CN        111145802      5/2020
KR        20090011452    2/2009
(Continued)

OTHER PUBLICATIONS

Office Action dated Jul. 19, 2022 from corresponding application No. KR 10-2021-0059073.
(Continued)

*Primary Examiner* — Fernando Hidalgo
(74) *Attorney, Agent, or Firm* — Hauptman Ham, LLP

(57) ABSTRACT

An integrated circuit (IC) device includes memory cells each including first through fourth memory elements. The first memory element is physically arranged, along a first axis, between a bit line and a first auxiliary conductive line. The second memory element is physically arranged, along the first axis, between a second auxiliary conductive line and a first conductor. The first and second memory elements are arranged in a first row along the first axis. The third memory element is physically arranged, along the first axis, between the first auxiliary conductive line and a second conductor electrically coupled to the first conductor. The fourth memory element is physically arranged, along the first axis,
(Continued)

between the bit line and the second auxiliary conductive line. The third and fourth memory elements are arranged, along the first axis, in a second row spaced from the first row along an axis transverse to the first axis.

20 Claims, 28 Drawing Sheets

Related U.S. Application Data continuation of application No. 17/198,675, filed on Mar. 11, 2021, now Pat. No. 11,450,362.

(60) Provisional application No. 63/032,257, filed on May 29, 2020.

(58) Field of Classification Search
CPC ............ G11C 2213/75; G11C 13/0007; G11C 13/0028; G11C 13/003; G11C 13/0069; G11C 16/0483; G11C 13/004; G11C 16/34; G11C 7/18; G11C 8/14; G06F 30/39; H10B 63/80
USPC .................................................. 365/185.17
See application file for complete search history.

(56)  References Cited

U.S. PATENT DOCUMENTS

| | | | |
|---|---|---|---|
| 9,256,709 B2 | 2/2016 | Yu et al. | |
| 9,601,194 B2 | 3/2017 | Nazarian | |
| 10,354,716 B2 | 7/2019 | Luo et al. | |
| 11,450,362 B2 * | 9/2022 | Young | G11C 8/08 |
| 11,915,787 B2 * | 2/2024 | Young | G11C 8/08 |
| 2006/0044872 A1 | 3/2006 | Nazarian | |
| 2008/0298119 A1 | 12/2008 | Hung et al. | |
| 2009/0027955 A1 | 1/2009 | Koh et al. | |
| 2010/0020589 A1 | 1/2010 | Doumae et al. | |
| 2011/0032749 A1 | 2/2011 | Liu et al. | |
| 2013/0223127 A1 | 8/2013 | Park et al. | |
| 2014/0040838 A1 | 2/2014 | Liu et al. | |
| 2015/0278429 A1 | 10/2015 | Chang | |
| 2020/0143883 A1 | 5/2020 | Joo et al. | |

FOREIGN PATENT DOCUMENTS

| | | |
|---|---|---|
| KR | 1020130085820 | 7/2013 |
| KR | 20130098003 | 9/2013 |
| KR | 1020130127180 | 11/2013 |
| KR | 1020180087809 | 4/2017 |
| KR | 1020200006705 | 1/2020 |
| KR | 1020200021413 | 2/2020 |
| TW | I665669 | 7/2019 |
| WO | WO2015130699 | 9/2015 |

OTHER PUBLICATIONS

Office Action dated Nov. 22, 2021 from corresponding application No. TW 11021138740 (pp. 1-4).

* cited by examiner

Conductor
Memory film
Gate
Active region
Isolation 1
Isolation 2
Isolation 3

Y axis

X axis

Conductor
Memory film
Gate
Active region
Isolation 3

Z axis
Y axis
X axis

Conductor
Memory film
Active region
Isolation 1
Isolation 3

Conductor

Memory film

Active region

Isolation 1

Isolation 3

Z axis

Y axis

X axis

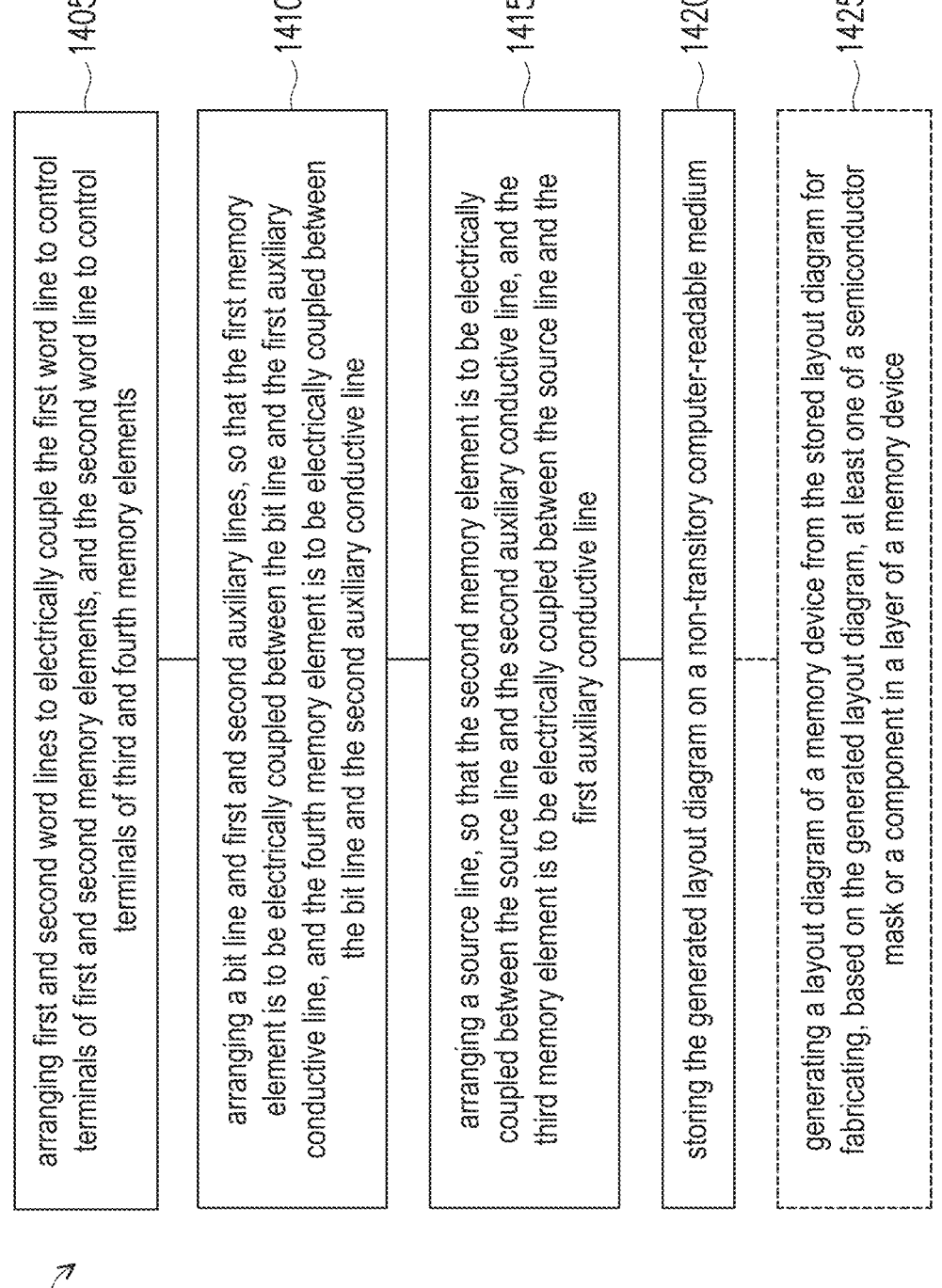

1400 arranging first and second word lines to electrically couple the first word line to control terminals of first and second memory elements, and the second word line to control terminals of third and fourth memory elements — 1405 arranging a bit line and first and second auxiliary lines, so that the first memory element is to be electrically coupled between the bit line and the first auxiliary conductive line, and the fourth memory element is to be electrically coupled between the bit line and the second auxiliary conductive line — 1410 arranging a source line, so that the second memory element is to be electrically coupled between the source line and the second auxiliary conductive line, and the third memory element is to be electrically coupled between the source line and the first auxiliary conductive line — 1415 storing the generated layout diagram on a non-transitory computer-readable medium — 1420 generating a layout diagram of a memory device from the stored layout diagram for fabricating, based on the generated layout diagram, at least one of a semiconductor mask or a component in a layer of a memory device — 1425

FIG. 14

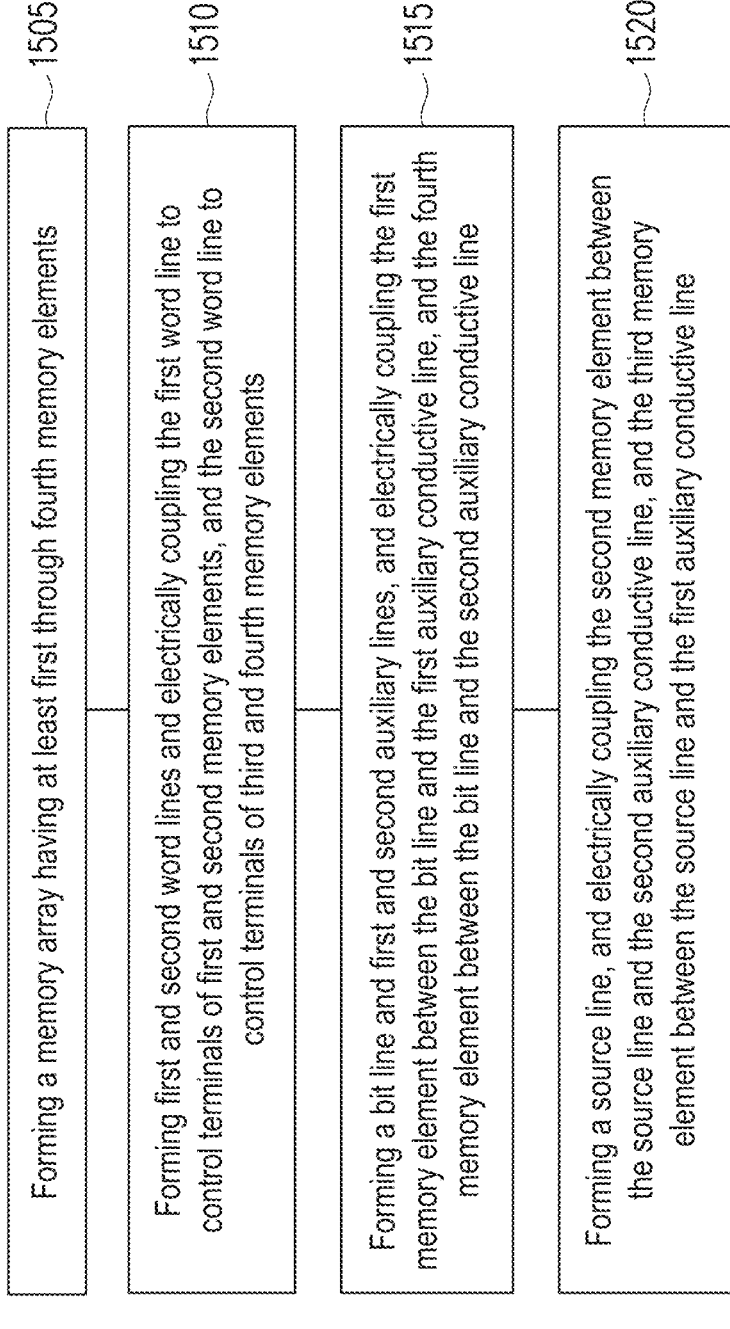

1500

1505

Forming a memory array having at least first through fourth memory elements

1510

Forming first and second word lines and electrically coupling the first word line to control terminals of first and second memory elements, and the second word line to control terminals of third and fourth memory elements

1515

Forming a bit line and first and second auxiliary lines, and electrically coupling the first memory element between the bit line and the first auxiliary conductive line, and the fourth memory element between the bit line and the second auxiliary conductive line

1520

Forming a source line, and electrically coupling the second memory element between the source line and the second auxiliary conductive line, and the third memory element between the source line and the first auxiliary conductive line

FIG. 15

INTEGRATED CIRCUIT DEVICE AND METHODS

RELATED APPLICATION(S)

The instant application is a continuation application of application Ser. No. 17/815,113, filed Jul. 26, 2022, now U.S. Pat. No. 11,915,787, issued Feb. 27, 2024, which is a continuation application of application Ser. No. 17/198,675, filed Mar. 11, 2021, now U.S. Pat. No. 11,450,362, issued Sep. 20, 2022, which claims the benefit of U.S. Provisional Application No. 63/032,257, filed May 29, 2020. The above-listed patents and applications are incorporated by reference herein in their entireties.

BACKGROUND

An integrated circuit (IC) device includes a number of semiconductor devices represented in an IC layout diagram. An IC layout diagram is hierarchical and includes modules which carry out higher-level functions in accordance with the semiconductor device design specifications. The modules are often built from a combination of cells, each of which represents one or more semiconductor structures configured to perform a specific function. Cells having pre-designed layout diagrams, sometimes known as standard cells, are stored in standard cell libraries (hereinafter "libraries" or "cell libraries" for simplicity) and accessible by various tools, such as electronic design automation (EDA) tools, to generate, optimize and verify designs for ICs. Examples of semiconductor devices and cells correspondingly include memory devices and memory cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 14 is a flow chart of a method, in accordance with some embodiments.

FIG. 15 is a flow chart of a method, in accordance with some embodiments.

DETAILED DESCRIPTION

Figure 1:
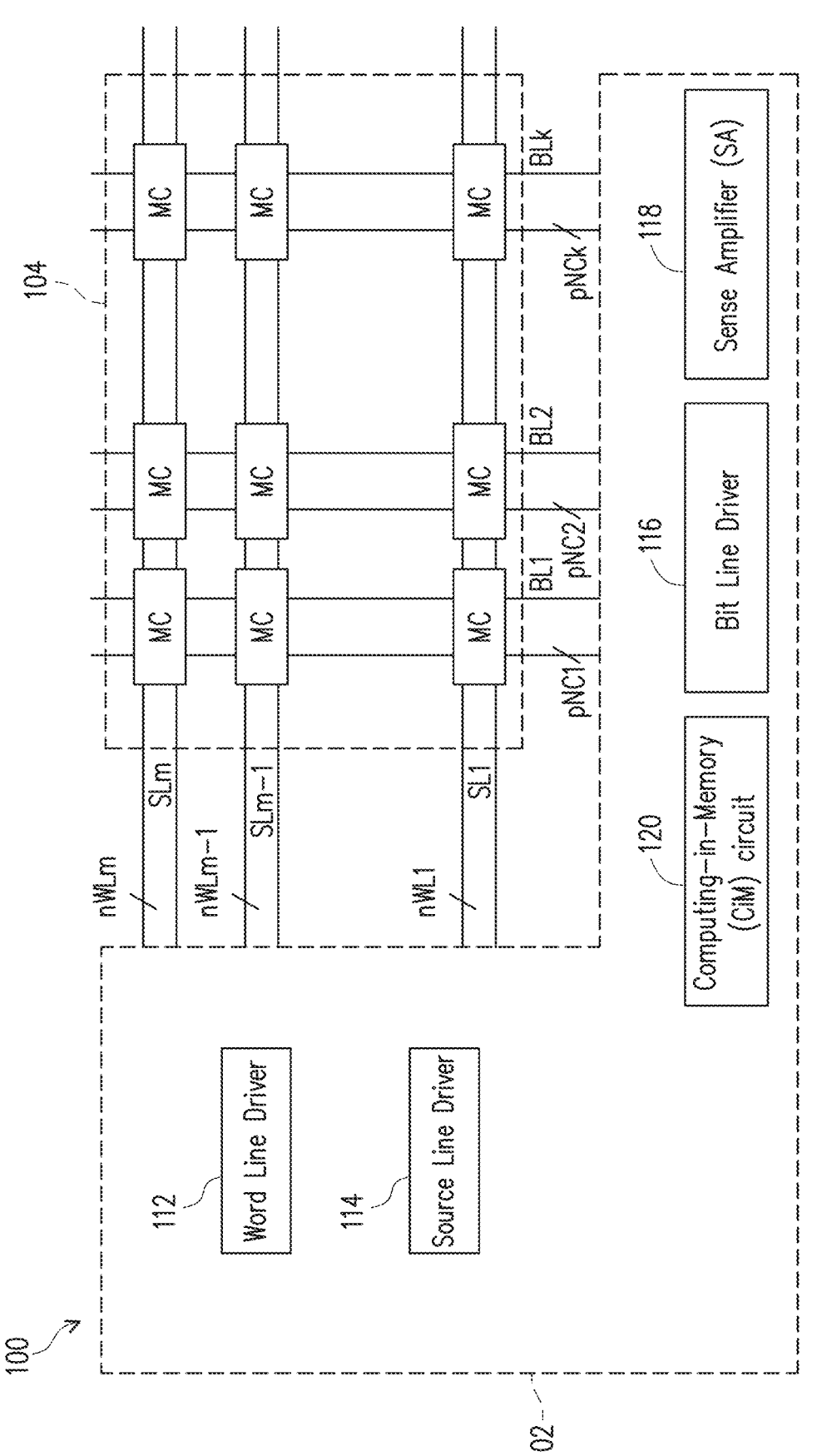
FIG. 1 is a schematic block diagram of a memory device, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Source/drain(s) may refer to a source or a drain, individually or collectively dependent upon the context.

A memory cell comprises a plurality of memory strings coupled in parallel between a bit line and a source line. Each memory string comprises a plurality of memory elements coupled in series between the bit line and the source line, and electrically coupled correspondingly to a plurality of word lines. Each memory element is programmable to have different resistance values. A resistance value of each memory string varies in accordance with the resistance values of the memory elements in the memory string. A total resistance value of the memory cell varies in accordance with the resistance values of the memory strings. As a result, the memory cell is programmable to have different total resistance values, corresponding to different data stored in the memory cell. In other words, the memory cell is a multi-level cell (MLC). In some embodiments, a memory device comprising a plurality of described memory cells is configured as an MLC memory for storing data. In one or more embodiments, the MLC memory is further configured for in-memory computing. In at least one embodiment, it is possible to achieve one or more advantages including, but not limited to, larger memory window, better computation performance, or the like.

FIG. 1 is a schematic block diagram of a memory device 100, in accordance with some embodiments. A memory device is a type of an IC device. In at least one embodiment, a memory device is an individual IC device. In some embodiments, a memory device is included as a part of a larger IC device which comprises circuitry other than the memory device for other functionalities.

The memory device 100 comprises at least one memory cell MC and a controller (also referred to as "control circuit") 102 coupled to control an operation of the memory cell MC. In the example configuration in FIG. 1, the memory device 100 comprises a plurality of memory cells MC arranged in a plurality of columns and rows in a memory array 104. Each memory cell MC comprises a plurality of memory elements, as described herein.

The memory device 100 further comprises a plurality of word lines and a plurality of source lines extending along the rows of the memory array 104, and a plurality of bit lines and a plurality of auxiliary conductive lines (also referred to herein as "auxiliary lines") extending along the columns of the memory array 104. The word lines are commonly referred to herein as WL, the source lines are commonly referred to herein as SL, the bit lines are commonly referred to herein as BL, and the auxiliary lines are commonly referred to herein as NC. For example, the memory device 100 comprises m source lines identified as SL1, . . . SLm−1, SLm, k bit lines identified as BL1, BL2 . . . BLk, m word line sets nWL1, . . . nWLm−1, nWLm each comprising n word lines, and k auxiliary conductive line sets pNC1, pNC2 . . . pNCk each comprising p auxiliary lines. Each of k, m, n, p is a natural number equal to or greater than 2.

Each of the memory cells MC is coupled to the controller 102 by a corresponding source line, a corresponding bit line, a corresponding word line set, and a corresponding auxiliary conductive line set. The word lines WL are configured for transmitting addresses of memory cells MC, or memory elements in the memory cell MCs, to be read from, and/or to be written to, or the like. The word lines WL are sometimes referred to as "address lines." The source lines SL, the bit lines BL and/or the auxiliary lines NC are configured for transmitting data to be written to, and/or read from, the memory cells MC, or memory elements in the memory cell MCs, indicated by the addresses on the corresponding word lines WL, or the like. The source lines SL, the bit lines BL and/or the auxiliary lines NC are sometimes referred to as "data lines." Various numbers of word lines WL and/or bit lines BL and/or source lines SL and/or auxiliary lines NC in the memory device 100 are within the scope of various embodiments.

In the example configuration in FIG. 1, the controller 102 comprises a word line driver 112, a source line driver 114, a bit line driver 116, a sense amplifier (SA) 118, and a computing-in-memory (CiM) circuit 120 which are configured to perform at least one of a read operation or a write operation. In at least one embodiment, the controller 102 further includes one or more clock generators for providing clock signals for various components of the memory device 100, one or more input/output (I/O) circuits for data exchange with external devices, and/or one or more controllers for controlling various operations in the memory device 100.

The word line driver 112 (also referred as "WL decoder") is coupled to the memory array 104 via the word lines WL. The word line driver 112 is configured to decode a row address of the memory cell MC, or memory elements in the memory cell MC, selected to be accessed in a read operation or a write operation. The word line driver 112 is configured to supply a set of voltages to the selected word lines WL corresponding to the decoded row address, and a different set of voltages to the other, unselected word lines WL. The source line driver 114 (also referred as "SL decoder") is coupled to the memory array 104 via the source lines SL. The bit line driver 116 (also referred as "BL decoder") is coupled to the memory array 104 via the bit lines BL.

In at least one embodiment, the bit line driver 116 is further coupled to the memory array 104 via the auxiliary lines NC. In some embodiments, the controller 102 comprises a separate NC driver or decoder (not shown) coupled to the memory array 104 via the auxiliary lines NC. The source line driver 114 and/or the bit line driver 116 and/or the NC driver is/are configured to decode a column address of the memory cell MC, or memory elements in the memory cell MC, selected to be accessed in a read operation or a write operation. The source line driver 114 and/or the bit line driver 116 and/or the NC driver is/are configured to supply a set of voltages to the selected source line SL, the selected bit line BL and/or the selected auxiliary line(s) NC corresponding to the selected memory cell MC, or selected memory elements in the memory cell MC, and a different set of voltages to the other, unselected source lines SL, unselected bit lines BL, and unselected auxiliary lines NC. For example, in a write operation (also referred to as "programming operation"), the source line driver 114 and/or the bit line driver 116 and/or the NC driver is/are configured to supply a write voltage (also referred to as "program voltage") across a memory element selected to be written to program the selected memory element. In some embodiments, the SA 118 is coupled to the memory array 104 via the bit lines BL. In a read operation, the source line driver 114 is configured to supply a read voltage to the selected source line SL, and the SA 118 is configured to sense data read from the accessed memory cell MC and retrieved through the corresponding selected bit line BL. In some embodiments, the SA 118 is coupled to the memory array 104 via the source lines SL. In a read operation, the controller 102 is configured to apply a read voltage to the selected bit line BL, and the SA 118 is configured to sense data read from the accessed memory cell MC and retrieved through the corresponding selected source line SL.

In at least one embodiment, the CiM circuit 120 is coupled to the SA 118 to receive the data read from one or more memory cell MCs of the memory array 104. The CiM circuit 120 is configured to perform one or more mathematical and/or logical operations based on the data read from the one or more memory cell MCs and also based on one or more control signals. The one or more control signals is/are received from other internal control circuitry (not shown) in the controller 102 and/or from external control circuitry. In some embodiments, the controller 102 is configured to coordinate one or more mathematical and/or logical operations performed by the CiM circuit 120 with one or more read operations and/or one or more write operations as described herein, to perform one or more computing-in-memory (CiM) operations. In at least one embodiment, CiM operations are advantageous over other approaches, where data are moved back and forth between the memory and a processor, because such back-and-forth data movement which is a bottleneck to both performance and energy efficiency is avoidable. Examples CiM applications include, but are not limited to, artificial intelligence, image recognition, neural network for machine learning, or the like. In some embodiments, the CiM circuit 120 is omitted and the memory device 100 is configured for data storage. The described memory device configuration is an example, and other memory device configurations are within the scopes of various embodiments.

Figure 2:
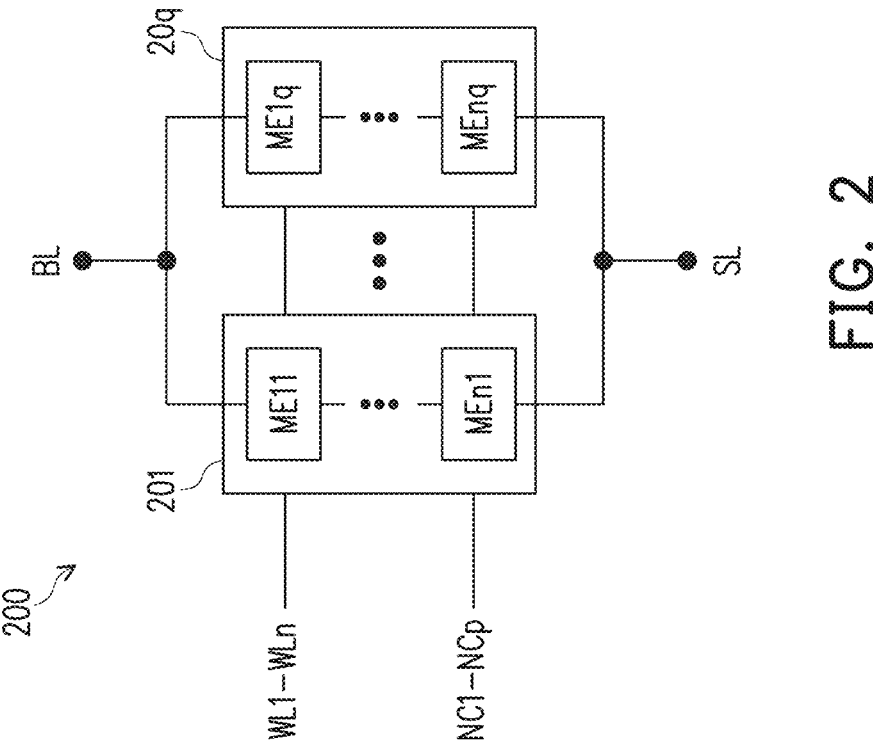
FIG. 2 is a schematic block diagram of a memory cell, in accordance with some embodiments.

FIG. 2 is a schematic block diagram of a memory cell 200, in accordance with some embodiments. In at least one embodiment, the memory cell 200 corresponds to one of the memory cells MC in the memory device 100.

In FIG. 2, the memory cell 200 is coupled to a source line SL, a bit line BL, a word line set comprising n word lines WL1 to WLn, and an auxiliary conductive line set comprising p auxiliary lines NC1-NCp. In at least one embodiment, the source line SL corresponds to one of the source lines SL1, . . . SLm−1, SLm, the bit line BL corresponds to one of the bit lines BL1, BL2 . . . BLk, the word line set WL1 to WLn corresponds to one of the word line sets n WL1, . . . nWLm−1, nWLm, and the auxiliary conductive line set NC1-NCp corresponds to one of the auxiliary conductive line sets pNC1, pNC2 . . . pNCk in the memory device 100.

The memory cell 200 comprises a plurality of memory strings coupled in parallel between the bit line BL and the source line SL. In the example configuration in FIG. 2, the memory cell 200 comprises q memory strings, two of which are indicated as 201, 20q, where q is a natural number equal to or greater than 2. Each of the plurality of memory strings comprises a plurality of memory elements coupled in series between the bit line BL and the source line SL, and electrically coupled correspondingly to the plurality of word lines. For example, the memory string 201 comprises a plurality of memory elements ME11 to MEn1 which are coupled in series between the bit line BL and the source line SL. The memory elements ME11 to ME1n are correspondingly coupled to the word lines WL1 to WLn. In another example, the memory string 20q comprises a plurality of memory elements ME1q to MEnq which are coupled in series between the bit line BL and the source line SL. The memory elements ME1q to MEnq are correspondingly coupled to the word lines WL1 to WLn. In some embodiments, the order of the memory elements ME11 to ME1n in the memory string 201, and/or the order of the memory elements ME1q to MEnq the memory string 20q is/are not necessarily as shown in the example configuration in FIG. 2.

Each memory element in the memory cell 200 is programmable to have different resistance values. A resistance value of each memory string varies in accordance with the resistance values of the memory elements in the memory string. For example, the memory string 201 has a resistance value corresponding to the sum of the resistance values of the memory elements ME11 to MEn1 in the memory string 201. At various resistance values of the memory elements ME11 to MEn1, the memory string 201 has corresponding various resistance values. For another example, at various resistance values of the memory elements ME1q to MEnq, the memory string 20q has corresponding various resistance values. The various resistance values of the memory strings 201 to 20q, which are coupled in parallel between the bit line BL and the source line SL, result in various total resistance values of the memory cell 200. As a result, the memory cell 200 is programmable to have different total resistance values, corresponding to different data stored in the memory cell 200.

Examples of memory elements, which are programmable to have different resistance values, include, but are not limited to, resistive random access memory (ReRAM or RRAM), magnetic RAM (MRAM), phase change memory (PCM), flash memory comprising charge storage material or floating gate, or the like. Details regarding RRAM are found, e.g., in U.S. Pat. No. 9,053,781, granted Jun. 9, 2015, the entirety of which is hereby incorporated by reference. Both NOR and NAND gate flash memories are applicable to implement memory elements of the memory cell 200 in one or more embodiments. A RRAM, MRAM or PCM memory element comprises an access transistor electrically coupled in series with a memory layer. The memory layer is programmable to have two or more states corresponding to two or more resistance values of the memory element. The gate of the access transistor of the RRAM, MRAM or PCM memory element corresponds to a control terminal of the memory element, and is electrically coupled to a corresponding word line among the word lines WL1 to WLn. A flash memory element comprises a transistor having a floating gate or a charge storage layer. The floating gate or charge storage layer is programmable to store two or more level of charges corresponding to two or more resistance values of the memory element. The gate of the transistor of the flash memory element corresponds to a control terminal of the memory element, and is electrically coupled to a corresponding word line among the word lines WL1 to WLn. Other types or configurations of memory elements are within the scopes of various embodiments.

In some embodiments, each of the memory elements in the memory cell 200 is individually programmable independently of other memory elements in the memory cell 200. In a programming operation of a selected memory element, a turn-ON voltage is applied, e.g., by a controller corresponding to the controller 102, to the control terminal of the selected memory element via the corresponding word line. For example, a turn-ON voltage is applied to the word line WL1 and turns ON the memory element ME11, which is the selected memory element, and the other non-selected memory element(s), e.g., ME1q, coupled to the word line WL1. A write voltage is applied, e.g., by the controller, across the selected memory element without erasing or disturbing programmed states of the other non-selected memory elements in the memory cell 200, especially the non-selected memory elements electrically coupled to the word line having the turn-ON voltage. Depending on where the selected memory element is arranged in the corresponding memory string, the write voltage is applied across the selected memory element from the bit line BL and one of the auxiliary lines NC1-NCp, or from the source line SL and one of the auxiliary lines NC1-NCp, or from two of the auxiliary lines NC1-NCp. The number and/or electrical connections of the auxiliary lines NC1-NCp depend on the number n of memory elements in each memory string, and the number q of the memory strings in the memory cell 200. In at least one embodiment, one of the auxiliary lines NC1-NCp is coupled to program more than one memory elements in the memory cell 200.

In a read operation, the auxiliary lines NC1-NCp are left floating, a turn-ON voltage is applied by the controller to the word lines WL1 to WLn to turn ON all of the memory elements of the memory cell 200, a read voltage is applied by the controller across the bit line BL and the source line SL to cause a read current to flow through the parallel coupled memory strings 201 to 20q of the memory cell 200. The controller is configured to detect the read current, e.g., by a sense amplifier corresponding to the SA 118, and determine a total resistance value of the memory cell 200 based on the read current and the read voltage. The controller is further configured to determine data stored in the memory cell 200 based on the determined total resistance value of the memory cell 200.

Figure 3:
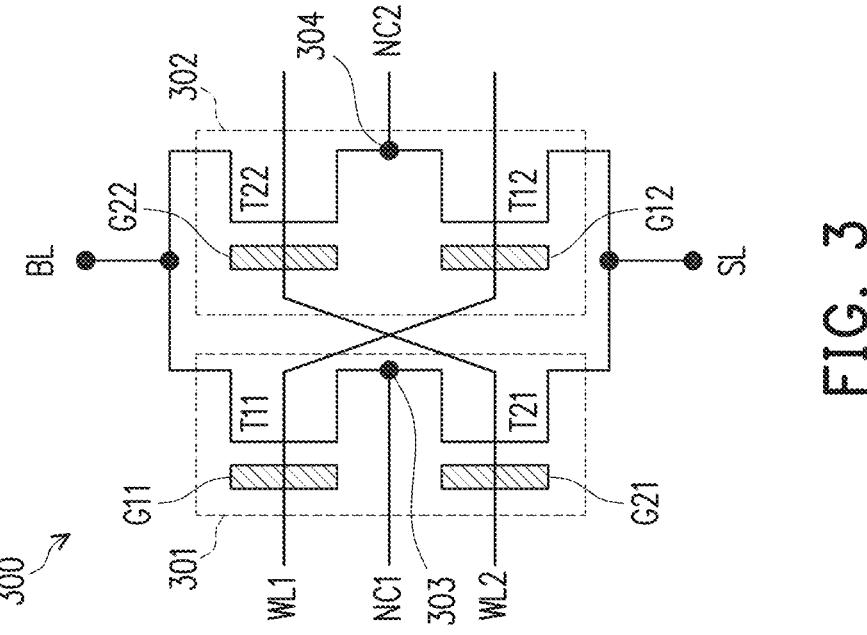
FIG. 3 is a schematic circuit diagram of a memory cell, in accordance with some embodiments.

FIG. 3 is a schematic circuit diagram of a memory cell 300, in accordance with some embodiments. In at least one embodiment, the memory cell 300 corresponds to a configuration of the memory cell 200 where n=p=q=2.

In FIG. 3, the memory cell 300 comprises memory elements T11, T12, T21, T22 arranged in memory strings 301, 302 coupled in parallel between the source line SL and the bit line BL. Each of the memory elements T11, T12, T21, T22 is programmable to have different resistance values. In the example configuration in FIG. 3, each of the memory elements T11, T12, T21, T22 is a transistor having a charge storage material. However, as described herein, other types of memory elements including, but not limited to, RRAM, MRAM, PCM, flash memory with floating gate, or the like, are within the scopes of various embodiments. Examples of the transistors T11, T12, T21, T22 include, but are not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like. In the example configuration described with respect to FIG. 3, the T11, T12, T21, T22 are NMOS transistors. Other configurations including PMOS transistors instead of NMOS transistors are within the scopes of various embodiments.

The transistors T11, T21 are electrically coupled in series between the source line SL and the bit line BL, and form the memory string 301. For example, a first source/drain of the transistor T11 is electrically coupled to the bit line BL, a second source/drain of the transistor T11 is electrically coupled to an intermediate node 303, a first source/drain of the transistor T21 is electrically coupled to the intermediate node 303, and a second source/drain of the transistor T21 is electrically coupled to the source line SL. The transistors T12, T22 are electrically coupled in series between the source line SL and the bit line BL, and form the memory string 302. For example, a first source/drain of the transistor T22 is electrically coupled to the bit line BL, a second source/drain of the transistor T22 is electrically coupled to an intermediate node 304, a first source/drain of the transistor T12 is electrically coupled to the intermediate node 304, and a second source/drain of the transistor T12 is electrically coupled to the source line SL. Gates G11, G12 of the transistors T11, T12 are electrically coupled to a word line WL1. Gates G21, G22 of the transistors T21, T22 are electrically coupled to a word line WL2. Auxiliary lines NC1, NC2 are correspondingly electrically coupled to the intermediate nodes 303, 304. The transistors T11, T12, T21, T22 correspond to the memory elements of the memory cell 200, the memory strings 301, 302 correspond to the memory strings 201 to 20q of the memory cell 200, the word lines WL1, WL2 correspond to the word lines WL1 to WLn of the memory cell 200, and the auxiliary lines NC1, NC2 correspond to the auxiliary lines NC1-NCp of the memory cell 200.

In a programming operation, each of the transistors T11, T12, T21, T22 is individually programmable independently of other memory elements in the memory cell 300. For example, in a programming operation of the transistor T11, a turn-ON voltage is applied, e.g., by a controller corresponding to the controller 102, to the word line WL1 and turns ON the selected transistor T11, as well as the non-selected transistor T12. The other non-selected transistors T21, T22 remain OFF. While the selected transistor T11 is turned ON, a write voltage is applied by the controller across the transistor T11 from the bit line BL and the auxiliary line NC1. A polarity and/or a voltage level of the write voltage determine a state or resistance value to be programmed to the transistor T11. In an example, a higher voltage level of the write voltage results in a first programed state corresponding to a low resistance value, e.g., R, of the transistor T11, whereas a lower voltage level of the write voltage results in a second programed state corresponding to a high resistance value, e.g., 2R, of the transistor T11. In at least one embodiment, various voltage levels and/or polarity of the write voltage make it possible to switch the transistor T11 from the first programed state to the second programed state, and vice versa. Although the non-selected transistor T12 is also turned ON during the programming operation of the transistor T11, the controller is configured to keep a voltage across the transistor T12 from the source line SL and the auxiliary line NC2 insufficient to change or disturb a programed state already programed in the transistor T12. For example, the source line SL and the auxiliary line NC2 are grounded and/or left floating during the programming operation of the transistor T11. Each of the transistors T12, T21, T22 is individually programmable independently of other memory elements in the memory cell 300 in a manner similar to that described with respect to the transistor T11. For example, to program the transistor T12, the controller is configured to apply a write voltage across the transistor T12 from the source line SL and the auxiliary line NC2, while the bit line BL and the auxiliary line NC1 are grounded and/or left floating. To program the transistor T21, the controller is configured to apply a write voltage across the transistor T21 from the source line SL and the auxiliary line NC1, while the bit line BL and the auxiliary line NC2 are grounded and/or left floating. To program the transistor T22, the controller is configured to apply a write voltage across the transistor T22 from the bit line BL and the auxiliary line NC2, while the source line SL and the auxiliary line NC1 are grounded and/or left floating. The described resistance values of R and 2R and/or the number of programed states each of the transistors T11, T12, T21, T22 is programmable to have are examples. Other configurations are within the scopes of various embodiments. For example, in at least one embodiment, each of the transistors T11, T12, T21, T22 is programmable to have more than two programed states corresponding to more than two resistance values. In one or more embodiments, the resistance values each of the transistors T11, T12, T21, T22 is programmable to have are different from R and/or 2R.

In a read operation, a turn-ON voltage is applied by the controller to the word lines WL1, WL2 to turn ON all transistors T11, T12, T21, T22 of the memory cell 300. While the transistors T11, T12, T21, T22 are turned ON, a read voltage is applied by the controller across the bit line BL and the source line SL to cause a read current to flow through the parallel coupled memory strings 301, 302 of the memory cell 300. For example, the read voltage is applied by the controller to the bit line BL, whereas the source line SL is being grounded. The auxiliary lines NC1-NCp are left floating during the read operation. The controller is configured to detect the read current, e.g., by a sense amplifier corresponding to the SA 118, and determine a total resistance value of the memory cell 300 based on the read current and the read voltage. The controller is further configured to determine data stored in the memory cell 300 based on the determined total resistance value of the memory cell 300, as described with respect to FIGS. 4A-4B.

Figure 4A:
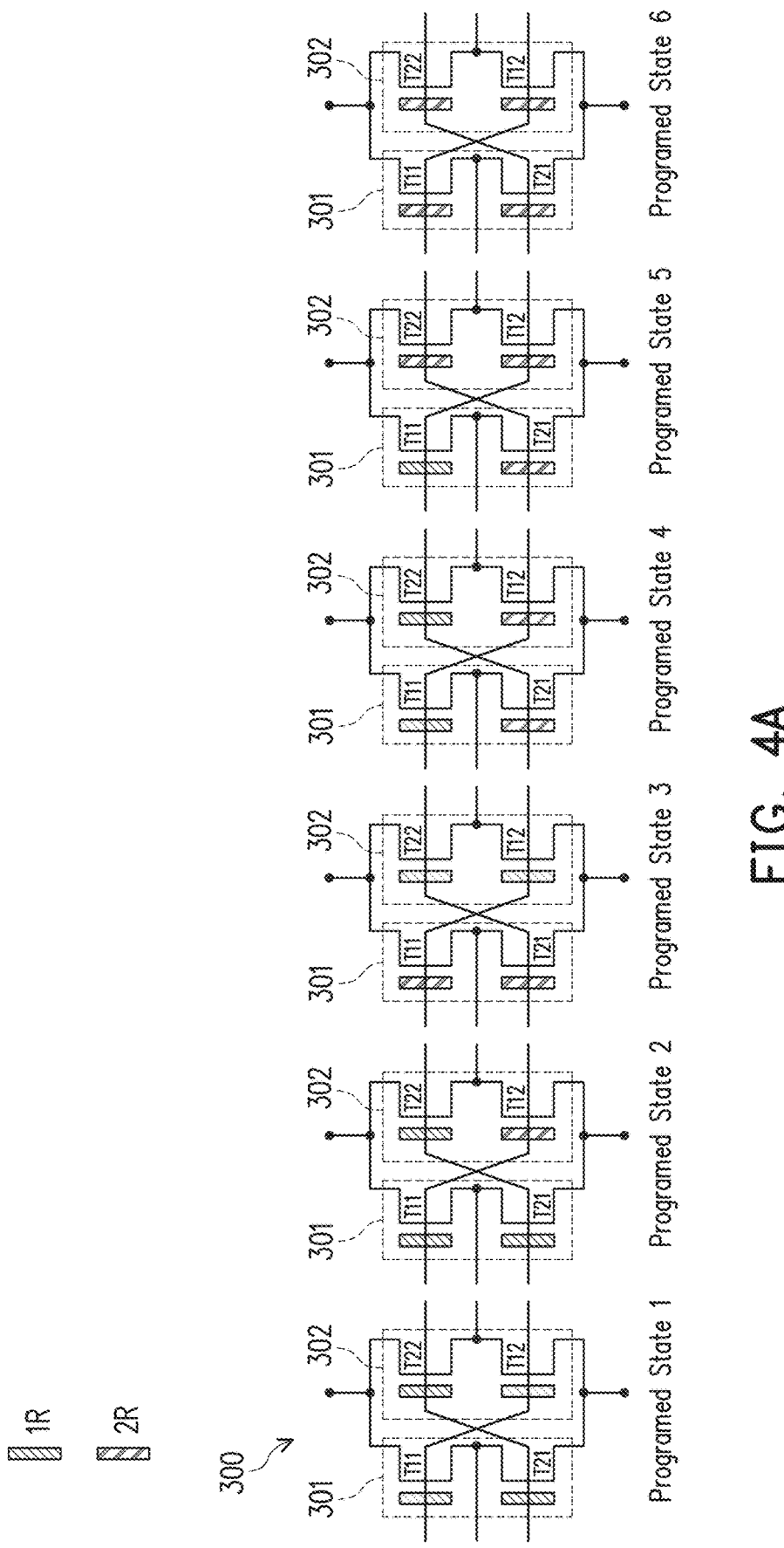
FIG. 4A includes schematic circuit diagrams of a memory cell in various programed states, in accordance with some embodiments.

FIG. 4A includes schematic circuit diagrams of the memory cell 300 in various programed states, in accordance with some embodiments. In the example configuration in FIG. 4A, each of the transistors T11, T12, T21, T22 is programmable to have either a resistance value R or a resistance value 2R. Other configurations are within the scopes of various embodiments.

In a programed state 1, each of the transistors T11, T12, T21, T22 is programmed to have a resistance value R. Each of the memory strings 301, 302 has a resistance value of 2R corresponding to the sum of the resistance values of the transistors in each memory string. The total resistance value of the memory cell 300 is the equivalent resistance value of two resistance values of 2R coupled in parallel. In other words, the total resistance value of the memory cell 300 is R.

In a programed state 2, one of the transistors, e.g., T12, is programmed to have a resistance value 2R, whereas the other transistors are programmed to have the resistance value R. One of the memory strings 301, 302 has a resistance value of 2R, whereas the other memory string has a resistance value of 3R. The total resistance value of the memory cell 300 is the equivalent resistance value of a resistance value of 2R coupled in parallel with a resistance value of 3R. In other words, the total resistance value of the memory cell 300 is 1.2R. This total resistance value remains unchanged if, instead of the transistor T12, another transistor among the transistors T11, T21, T22 is programmed to have a resistance value 2R.

In a programed state 3, the transistors in one memory string, e.g., 301, are programmed to have a resistance value 2R, whereas the transistors in the other memory string, e.g., 302, are programmed to have the resistance value R. The memory string 301 has a resistance value of 4R, whereas the memory string 302 has a resistance value of 2R. The total resistance value of the memory cell 300 is the equivalent resistance value of a resistance value of 2R coupled in parallel with a resistance value of 4R. In other words, the total resistance value of the memory cell 300 is 1.33R. This total resistance value remains unchanged if, the transistors in the memory string 302 are programmed to have a resistance value 2R, and the transistors in the memory string 301 are programmed to have the resistance value R.

In a programed state 4, in each of the memory strings 301, 302, one transistor, e.g., T21, T12, is programmed to have a resistance value 2R, whereas the other transistor, e.g., T11, T22, is programmed to have the resistance value R. Each memory string 301, 302 has a resistance value of 3R. The total resistance value of the memory cell 300 is the equivalent resistance value of two resistance values of 3R coupled in parallel. In other words, the total resistance value of the memory cell 300 is 1.5R. This total resistance value remains unchanged if, the transistor T11 is programed to have the resistance value 2R instead of the transistor T21 and/or the transistor T22 is programed to have the resistance value 2R instead of the transistor T12.

In a programed state 5, one of the transistors, e.g., T11, is programmed to have a resistance value R, whereas the other transistors are programmed to have the resistance value 2R. One of the memory strings 301, 302 has a resistance value of 3R, whereas the other memory string has a resistance value of 4R. The total resistance value of the memory cell 300 is the equivalent resistance value of a resistance value of 3R coupled in parallel with a resistance value of 4R. In other words, the total resistance value of the memory cell 300 is 1.7R. This total resistance value remains unchanged if, instead of the transistor T11, another transistor among the transistors T12, T21, T22 is programmed to have a resistance value R.

In a programed state 6, each of the transistors T11, T12, T21, T22 is programmed to have a resistance value 2R. Each of the memory strings 301, 302 has a resistance value of 4R. The total resistance value of the memory cell 300 is the equivalent resistance value of two resistance values of 4R coupled in parallel. In other words, the total resistance value of the memory cell 300 is 2R.

Figure 4B:
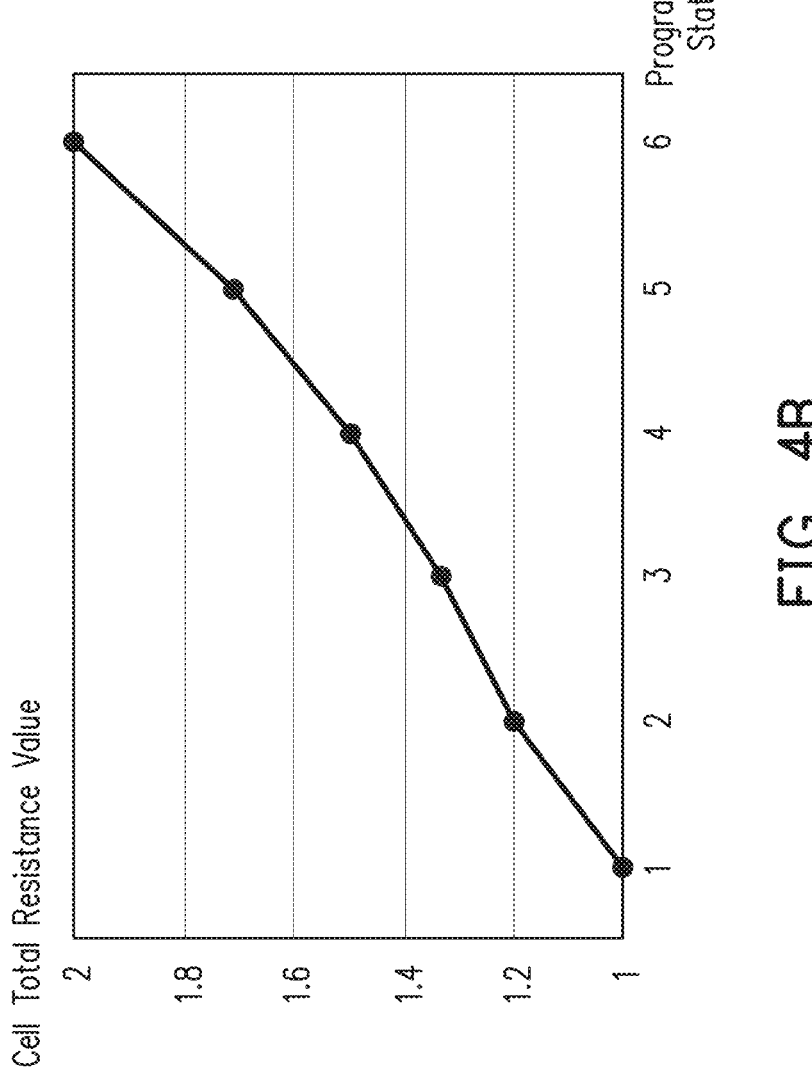
FIG. 4B is a graph showing different total resistance values of a memory cell in various programed states, in accordance with some embodiments.

FIG. 4B is a graph showing different total resistance values of the memory cell 300 in various programed states 1-6 described with respect to FIG. 4A, in accordance with some embodiments.

The described programed states 1-6 correspond to six different data or logic states stored in the memory cell 300, and also correspond to six different total resistance values R, 1.2R, 1.33R, 1.5R, 1.7R, 2R. The six different total resistance values correspond to different values of a read current flowing through the memory cell 300 under the read voltage applied across the bit line BL and source line SL. Based on the value of the read current detected by, e.g., a sense amplifier corresponding to the SA 118, the controller is configured to determine the total resistance value of the memory cell 300 and the corresponding data or logic states stored in the memory cell 300.

In FIG. 4B, the graph shows that the total resistance value of the memory cell 300 increases in a linearistic manner as the memory cell 300 switches from one programed state to the next in the order from the programed state 1 to the programed state 6. In at least one embodiment, this linearistic characteristic enables the controller to reliably distinguish each of the programed states 1-6 from adjacent programed states. In at least one embodiment, this feature makes it possible to achieve one or more advantages including, but not limited to, larger memory window, better computation performance, or the like.

Figure 5:
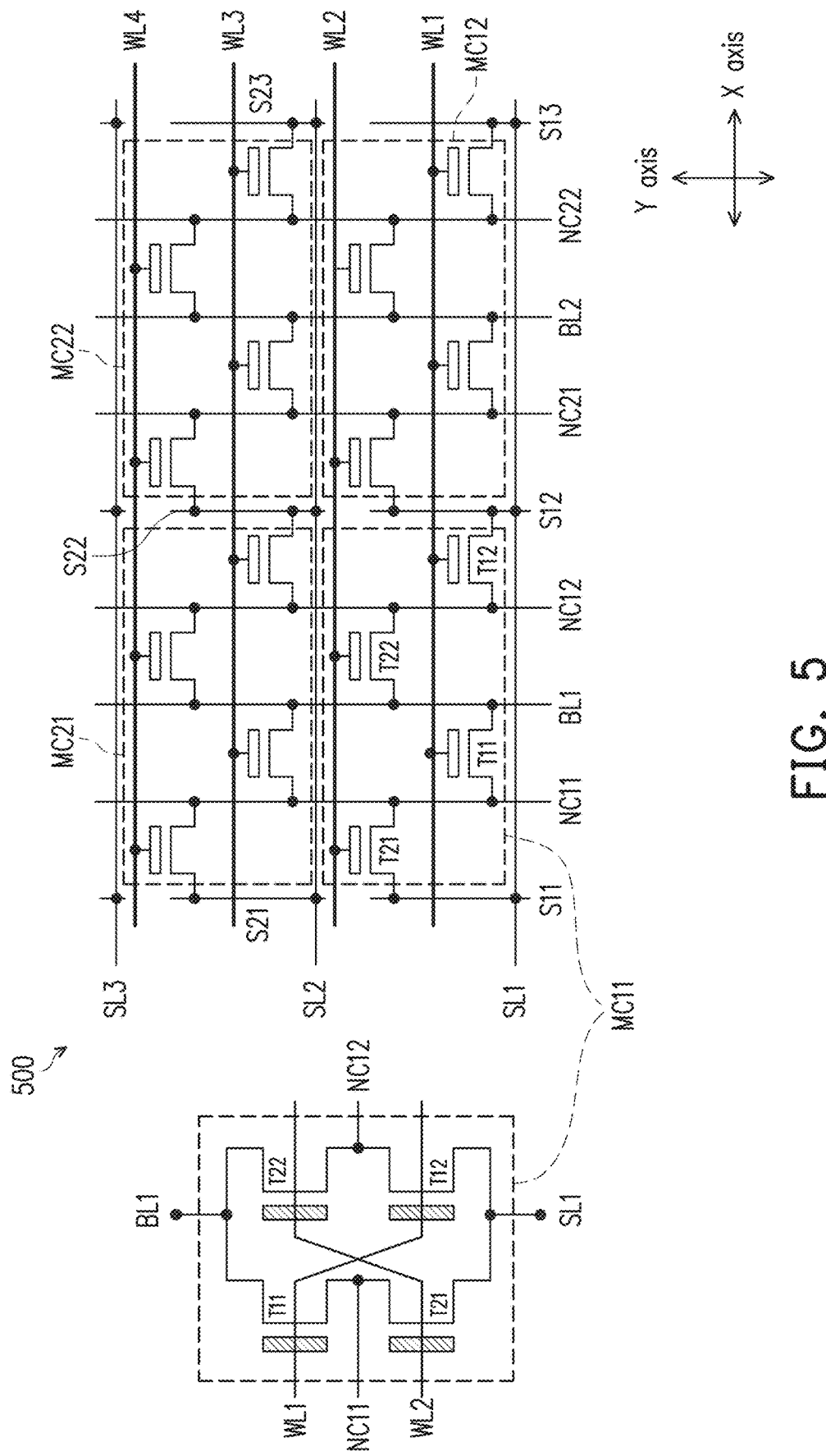
FIG. 5 is a schematic circuit diagram of a memory device, in accordance with some embodiments.

FIG. 5 is a schematic circuit diagram of a memory device 500, in accordance with some embodiments. In some embodiments, the memory device 500 corresponds to the memory device 100.

The memory device 500 comprises a plurality of memory cells MC11, MC12, MC21, MC22 arranged in an array having rows elongated along a first axis, e.g., an X axis, and columns elongated along a second axis, e.g., a Y axis. The Y axis is transverse to the X axis. In at least one embodiment, the Y axis is perpendicular to the X axis. The memory device 500 further comprises source lines SL1, SL2, SL3 and word lines WL1, WL2, WL3, WL4 elongated along the X axis, and bit lines BL1, BL2 and auxiliary lines NC11, NC12, NC21, NC22 elongated along the Y axis.

Each of the memory cells MC11, MC12, MC21, MC22 corresponds to the memory cell 300. For example, as illustrated in FIG. 5, the memory cell MC11 comprises transistors T11, T12, T21, T22 electrically coupled to the bit line BL1, source line SL1, auxiliary lines NC11, NC12, and word lines WL, WL2 in a manner similar to how the transistors T11, T12, T21, T22 are electrically coupled to the bit line BL, source line SL, auxiliary lines NC1, NC2, and word lines WL, WL2 as described with respect to the memory cell 300.

In the memory cell MC11, along the X axis, the arrangement of the transistor T11 between the bit line BL1 and the auxiliary line NC11 reflects a physical arrangement of the transistor T11 between the bit line BL1 and the auxiliary line NC11 in an actual semiconductor device or IC device corresponding to the memory device 500. Along the X axis, the arrangement of the transistor T22 between the bit line BL1 and the auxiliary line NC12 reflects a physical arrangement of the transistor T22 between the bit line BL1 and the auxiliary line NC12 in the actual semiconductor device. Along the X axis, the arrangement of the transistor T21 between the auxiliary line NC11 and a conductor S11 reflects a physical arrangement of the transistor T21 between the auxiliary line NC11 and the conductor S11 in the actual semiconductor device. The conductor S11 is electrically coupled to the source line SL1. Along the X axis, the arrangement of the transistor T12 between the auxiliary line NC12 and a conductor S12 reflects a physical arrangement of the transistor T12 between the auxiliary line NC12 and the conductor S12 in the actual semiconductor device. The conductor S12 is electrically coupled to the source line SL1. Along the X axis, the arrangement of the conductor S11, the auxiliary line NC11, the bit line BL1, the auxiliary line NC12 and the conductor S12 in the recited order reflects a physical arrangement of the conductor S11, the auxiliary line NC11, the bit line BL1, the auxiliary line NC12 and the conductor S12 in the actual semiconductor device. Along the Y axis, the arrangement of the transistors T11, T12 in a row and the transistors T21, T22 in another row, both rows and the corresponding word lines WL1, WL2 arranged between the source lines SL1, SL2, reflects a physical arrangement of the transistors T11, T12, T21, T22 and the word lines WL1, WL2 between the source lines SL1, SL2 in the actual semiconductor device.

The memory cell MC12 is configured similarly to the memory cell MC11. The memory cell MC12 is coupled to and arranged with respect to the conductor S12, the auxiliary line NC21, the bit line BL2, the auxiliary line NC22 and the conductor S13 in a manner similar to how the memory cell MC11 is coupled to and arranged with respect to the conductor S11, the auxiliary line NC11, the bit line BL1, the auxiliary line NC12 and the conductor S12. The conductor S13 is electrically coupled of the source line SL1. Further, the memory cell MC12 is coupled to and arranged with respect to the word lines WL1, WL2 in a manner similar to how the memory cell MC11 is coupled to and arranged with respect to the word lines WL1, WL2.

The memory cell MC21 is configured similarly to the memory cell MC11. The memory cell MC21 is coupled to and arranged with respect to the conductor S21, the auxiliary line NC11, the bit line BL1, the auxiliary line NC12 and the conductor S22 in a manner similar to how the memory cell MC11 is coupled to and arranged with respect to the conductor S11, the auxiliary line NC11, the bit line BL1, the auxiliary line NC12 and the conductor S12. The conductors S21, S22 are electrically coupled of the source line SL2. Further, the memory cell MC21 is coupled to and arranged with respect to the word lines WL3, WL4 in a manner similar to how the memory cell MC11 is coupled to and arranged with respect to the word lines WL1, WL2.

The memory cell MC22 is configured similarly to the memory cell MC21. The memory cell MC22 is coupled to and arranged with respect to the conductor S22, the auxiliary line NC21, the bit line BL2, the auxiliary line NC22 and the conductor S23 in a manner similar to how the memory cell MC21 is coupled to and arranged with respect to the conductor S21, the auxiliary line NC11, the bit line BL1, the auxiliary line NC12 and the conductor S22. The conductor S23 is electrically coupled of the source line SL2. Further, the memory cell MC22 is coupled to and arranged with respect to the word lines WL3, WL4 in a manner similar to how the memory cell MC21 is coupled to and arranged with respect to the word lines WL3, WL4.

Each of the bit lines BL1, BL2 and the auxiliary lines NC11, NC12, NC21, NC22 extend continuously along the Y axis across, and are electrically coupled to, multiple memory cells. The conductors S11, S21 are aligned along the Y axis, but are disconnected from each other. The conductors S12, S22 are aligned along the Y axis, but are disconnected from each other. The conductors S13, S23 are aligned along the Y axis, but are disconnected from each other. Each of the source lines SL1, SL2, SL3 and the word lines WL1, WL2, WL3, WL4 extend continuously along the X axis across, and are electrically coupled to, multiple memory cells. In at least one embodiment, one or more advantages described herein are achievable in the memory device 500.

Figure 6:
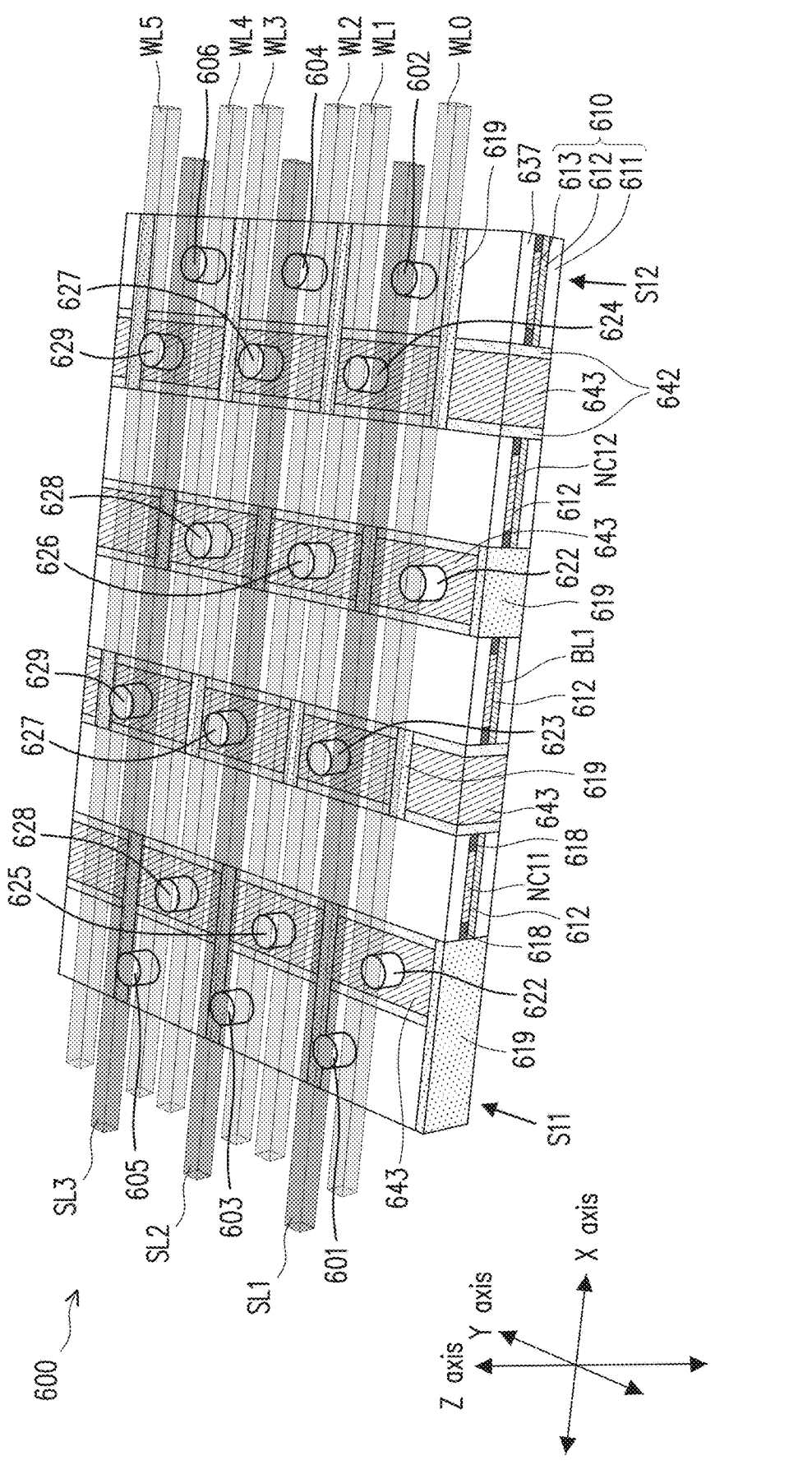
FIG. 6 is a schematic perspective view of a semiconductor device, in accordance with some embodiments.

FIG. 6 is a schematic perspective view of a semiconductor device or IC device 600, in accordance with some embodiments. In at least one embodiment, the semiconductor device 600 corresponds to a portion of the memory device 500 in FIG. 5. Corresponding elements in FIG. 5 and FIG. 6 are designated by the same reference numerals.

The semiconductor device 600 comprises, under the structure shown in FIG. 6, a substrate (not shown). In some embodiments, the substrate of the semiconductor device 600 corresponds to a substrate described with respect to one or more of FIGS. 8A-8G.

The semiconductor device 600 further comprises a memory array layer 610 over the substrate along a third axis, e.g., a Z axis, transverse to the X axis and the Y axis. In at least one embodiment, the Z axis is perpendicular to the X axis and the Y axis. The memory array layer 610 comprises various memory elements or transistors arranged in an array having rows along the X axis and columns along the Y axis, as described with respect to at least one of FIG. 1, FIG. 5. In the example configuration in FIG. 6, the memory array layer 610 comprises an isolation layer 611 over the substrate, an active region layer 612 over the isolation layer 611, and a source/drain contact layer 613 over the active region layer 612. The isolation layer 611 is configured to isolate the active region layer 612 from the substrate. In some embodiments, the isolation layer 611 is omitted, for example, when the substrate is a dielectric substrate.

The active region layer 612 comprises source/drains and channels of the transistors in the memory elements. Several source/drains are visible and commonly designated with the reference numerals 612 in FIG. 6. Channels of the transistors are not visible in FIG. 6, and are located between and connect source/drains adjacent each other along the X axis. In at least one embodiment, the source/drains and channels are formed in a plurality of active regions (not shown) elongated along the X axis, and spaced from each other along the Y axis. Example configurations of the source/drains and channels of transistors in the active region layer 612 are described with respect to one or more of FIGS. 8A-8G.

The memory array layer 610 further comprises gate electrodes (not shown) over the channels and between adjacent source/drains. Gate contacts 643 are over and electrically coupled to the underlying gate electrodes. The gate contacts 643 are arranged in columns, or gate regions, along the Y axis. Adjacent gate contacts 643 and the corresponding underlying gate electrodes in the same column are electrically isolated from each other by isolation structures 619 which are arranged at intervals along the Y axis. Along the X axis, the gate contacts 643 in one column are separated from the gate contacts 643 in an adjacent column by isolation structures in an isolation layer 637 over the memory array layer 610. A memory layer 642 is arranged on opposite sides of each of the gate contacts 643 along the X axis. The memory layer 642 is further arranged between the gate electrodes and the corresponding channels. Example configurations of the gate electrodes and memory layer in the memory array layer 610 are described with respect to one or more of FIGS. 8A-8G.

The source/drain contact layer 613 comprises a plurality of source/drain contacts over and electrically coupled to the underlying source/drains in the active region layer 612. Several of the source/drain contacts extend continuously along the Y axis, and correspond to various bit lines and auxiliary lines as described herein. For example, the source/drain contact layer 613 comprises a bit line BL1 and auxiliary lines NC11, NC12 corresponding to the bit line BL1 and auxiliary lines NC11, NC12 in FIG. 5. Other source/drain contacts are arranged in columns along the Y axis, but are disconnected from each other. For example, a column designated as S11 in FIG. 6 comprises source/drain contacts corresponding to the conductors S11, S21 which, as described with respect to FIG. 5, are aligned along the Y axis but disconnected from each other. For another example, a column designated as S12 in FIG. 6 comprises source/drain contacts corresponding to the conductors S12, S22 which, as described with respect to FIG. 5, are aligned along the Y axis but disconnected from each other. Along the X axis, each of the source/drain contacts is electrically isolated from adjacent gate contacts 643 and the corresponding memory layer 642 by isolation structures 618 which are elongated along the Y axis. Example isolation structures 618 are indicated on opposite sides of the auxiliary line NC11. Example configurations of the source/drain contacts are described with respect to one or more of FIGS. 8A-8G.

The semiconductor device 600 further comprises source lines SL1, SL2, SL3 and word lines WL0, WL1, WL2, WL3, WL4, WL5 over the memory array layer 610. The semiconductor device 600 comprises various isolation layers (not shown) between the memory array layer 610, the source lines SL1, SL2, SL3, and the word lines WL0, WL1, WL2, WL3, WL4, WL5. The word line WL0 in FIG. 6 corresponds to a word line electrically coupled to memory cells adjacent to the memory cells MC11, MC12 in FIG. 5, but on the opposite side to the memory cells MC21, MC22. The word line WL5 in FIG. 6 corresponds to a word line electrically coupled to memory cells adjacent to the memory cells MC21, MC22 in FIG. 5, but on the opposite side to the memory cells MC11, MC12. The word lines WL1, WL2 are arranged along the Y axis between the source lines SL1, SL2. The word lines WL3, WL4 are arranged along the Y axis between the source lines SL2, SL3. The source line SL1 is arranged along the Y axis between the word lines WL0, WL1. The source line SL3 is arranged along the Y axis between the word lines WL4, WL5.

The source line SL1 is electrically coupled to the source/drain contacts over the corresponding source/drains of the corresponding transistors in the memory array layer 610 by via structures 601, 602. The via structure 601 corresponds to the electrical connection between the source line SL1 and the conductor S11 in FIG. 5. The via structure 602 corresponds to the electrical connection between the source line SL1 and the conductor S12 in FIG. 5. The source line SL2 is electrically coupled to the source/drain contacts over the corresponding source/drains of the corresponding transistors in the memory array layer 610 by via structures 603, 604. The via structure 603 corresponds to the electrical connection between the source line SL2 and the conductor S21 in FIG. 5. The via structure 604 corresponds to the electrical connection between the source line SL2 and the conductor S22 in FIG. 5. The source line SL3 is electrically coupled to the source/drain contacts over the corresponding source/drains of the corresponding transistors in the memory array layer 610 by via structures 605, 606.

The word line WL0 is electrically coupled to the gate contacts over the corresponding gate electrodes of the corresponding transistors in the memory array layer 610 by via structures commonly designated as 622. The word line WL1 is electrically coupled to the gate contacts over the corresponding gate electrodes of the corresponding transistors in the memory array layer 610 by via structures 623, 624. The via structure 623 corresponds to the electrical connection between the word line WL1 and the gate of the transistor T11 in FIG. 5. The via structure 624 corresponds to the electrical connection between the word line WL1 and the gate of the transistor T12 in FIG. 5. The word line WL2 is electrically coupled to the gate contacts over the corresponding gate electrodes of the corresponding transistors in the memory array layer 610 by via structures 625, 626. The via structure 625 corresponds to the electrical connection between the word line WL2 and the gate of the transistor T21 in FIG. 5. The via structure 626 corresponds to the electrical connection between the word line WL2 and the gate of the transistor T22 in FIG. 5. The word line WL3 is electrically coupled to the gate contacts over the corresponding gate electrodes of the corresponding transistors in the memory array layer 610 by via structures commonly designated as 627. The word line WL4 is electrically coupled to the gate contacts over the corresponding gate electrodes of the corresponding transistors in the memory array layer 610 by via structures commonly designated as 628. The word line WL5 is electrically coupled to the gate contacts over the corresponding gate electrodes of the corresponding transistors in the memory array layer 610 by via structures commonly designated as 629. In at least one embodiment, one or more advantages described herein are achievable in the semiconductor device 600.

Figure 7:
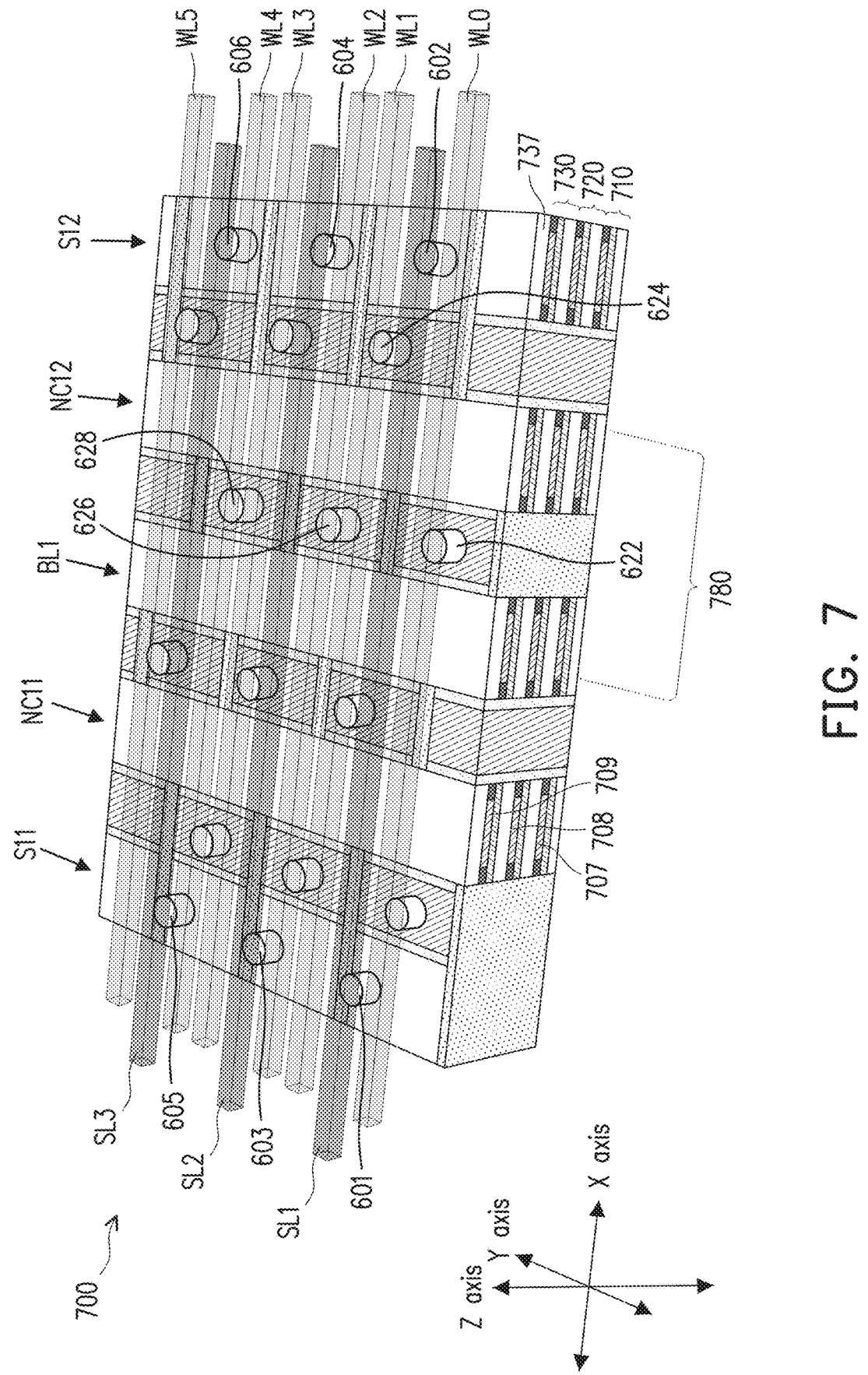
FIG. 7 is a schematic perspective view of a semiconductor device, in accordance with some embodiments.

FIG. 7 is a schematic perspective view of a semiconductor device 700, in accordance with some embodiments. Corresponding elements in FIG. 5, FIG. 6 and FIG. 7 are designated by the same reference numerals.

The semiconductor device 700 is similar to the semiconductor device 600; however, instead of one memory array layer as in the semiconductor device 600, the semiconductor device 700 comprises multiple memory array layers stacked one upon another along the Z axis. In the example configuration in FIG. 7, the semiconductor device 700 comprises three memory array layers 710, 720, 730 stacked one upon another in the recited order over a substrate (not shown). The memory array layer 710 corresponds to the memory array layer 610 in the semiconductor device 600. The memory array layers 720, 730 each have a configuration similar to the memory array layer 710. An isolation layer 737 corresponding to the isolation layer 637 of the semiconductor device 600 is over the memory array layer 730. The arrangement of the source lines SL1, SL2, SL3, the word lines WL0, WL1, WL2, WL3, WL4, WL5 and the corresponding via structures in the semiconductor device 700 is similar to the semiconductor device 600.

In the semiconductor device 700, three transistors correspondingly in the memory array layers 710, 720, 730 are stacked upon one another along the Z axis and have a common gate electrode. The common gate electrode is electrically coupled to the corresponding word line by a common via structure. For example, each of the via structures 622, 624, 626, 628 electrically couples the corresponding word line WL0, WL1, WL2, WL4 to the corresponding common gate electrode of three transistors each in a corresponding one of the memory array layers 710, 720, 730.

In each of the memory array layers 710, 720, 730, the source/drain contacts of the semiconductor device 700 comprise aligned but disconnected source/drain contacts arranged at intervals along the columns designated as S11, S12. The source/drain contacts of three transistors correspondingly in the memory array layers 710, 720, 730 are stacked upon one another along the Z axis and are commonly electrically coupled to the corresponding source line. For example, the via structure 601 electrically couples the corresponding source line SL1 to the corresponding source/drain contacts of three transistors each in a corresponding one of the memory array layers 710, 720, 730.

In each of the memory array layers 710, 720, 730, the source/drain contacts of the semiconductor device 700 further comprise continuously extending auxiliary lines NC11, NC12 and bit line BL1. For example, three continuous auxiliary lines 707, 708, 709 are correspondingly arranged in the memory array layers 710, 720, 730. Each of the auxiliary lines 707, 708, 709 corresponds to the auxiliary line NC11 in the memory device 500. The auxiliary lines 707, 708, 709 are separately electrically coupled to other circuitry in the semiconductor device 700 by configuring steps in end portions of the auxiliary lines 707, 708, 709 to form a stepwise structure, and by electrically coupling the end portions of the auxiliary lines 707, 708, 709 in the stepwise structure to corresponding via structures having different heights. Example configurations of the stepwise structure and corresponding via structures are described with respect to FIG. 9.

The described configuration of the semiconductor device 700 as comprising three memory array layers is an example. Other configurations in which the semiconductor device 700 comprises two, or more than three, memory array layers are within the scopes of various embodiments. In at least one embodiment, one or more advantages described herein are achievable in the semiconductor device 700. Further, the arrangement of multiple memory array layers in the semiconductor device 700 advantageously increases the memory density, in at least one embodiment.

FIGS. 8A-8G are various views of a portion 800 of a semiconductor device, in accordance with some embodiments. In at least one embodiment, the semiconductor device portion 800 corresponds to a region 780 of the semiconductor device 700 in FIG. 7. Unless otherwise described, components in FIGS. 8A-8G having corresponding components in FIG. 7 are designated by the same reference numerals of FIG. 7, or by the reference numerals of FIG. 7 increased by 100. Unless otherwise described, components in FIGS. 8A-8G having corresponding components in FIG. 6 are designated by the same reference numerals of FIG. 6, or by the reference numerals of FIG. 6 increased by 200.

Figure 8A:
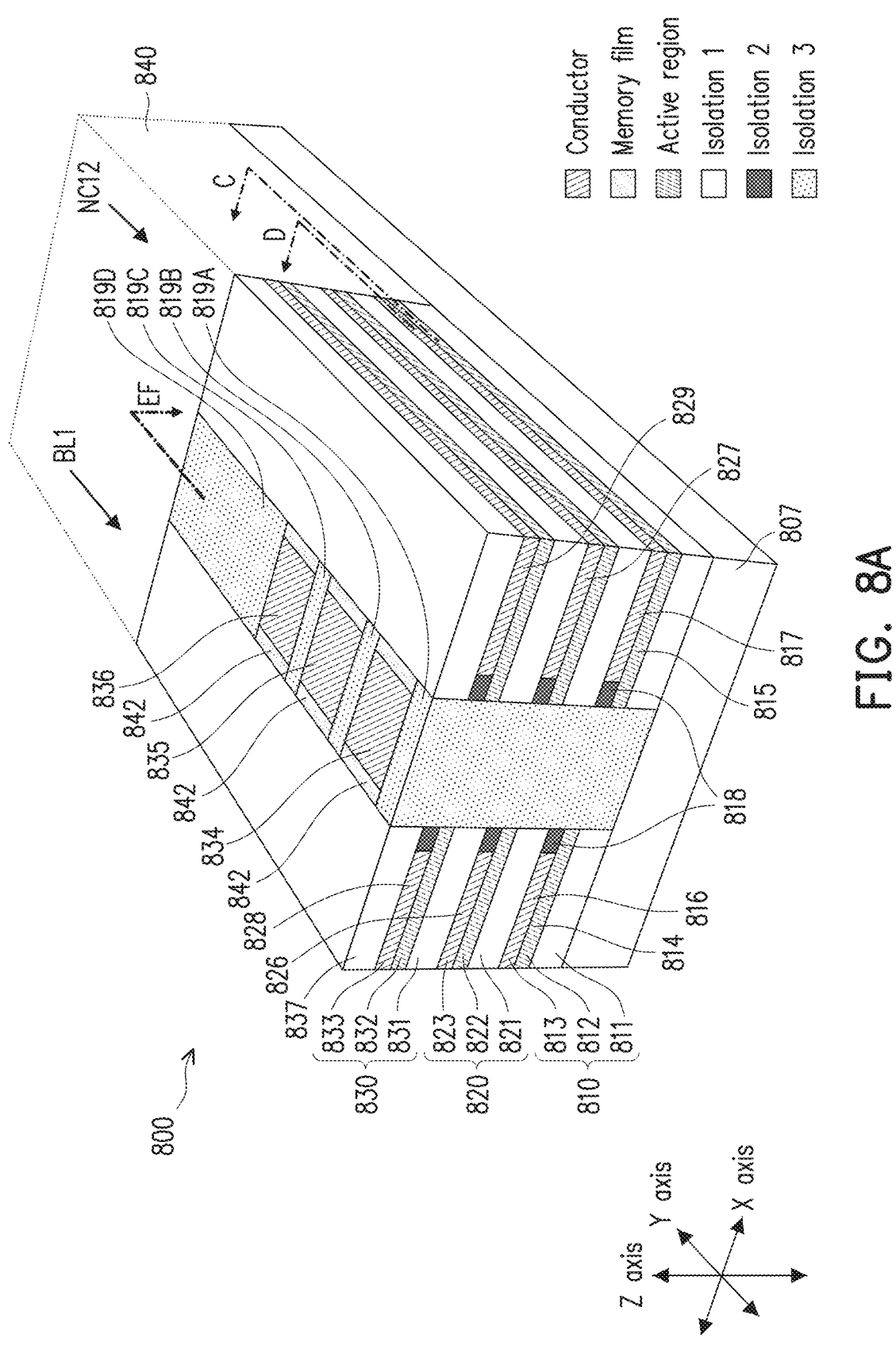
FIG. 8A is a schematic perspective view of a portion of a semiconductor device, in accordance with some embodiments.

FIG. 8A is a schematic perspective view of the semiconductor device portion 800, in accordance with some embodiments.

The semiconductor device portion 800 is formed over a substrate 807 which, in one or more embodiments, corresponds to the substrate of the semiconductor device 700. In some embodiments, the substrate 807 comprises a dielectric substrate, a semiconductor wafer, a semiconductor-on-insulator (SOI) wafer or an epitaxial wafer. The semiconductor wafer, the SOI wafer or the epitaxial wafer comprises, in one or more embodiments, an elemental semiconductor material or a compound semiconductor material. Examples of the elemental semiconductor include, but are not limited to, Si or Ge. Examples of the compound semiconductor include, but are not limited to, SiGe, SiC, SiGeC, a III-V semiconductor or a II-VI semiconductor.

Memory array layers 810, 820, 830 corresponding to the memory array layers 710, 720, 730 are sequentially formed over the substrate 807. Each of the memory array layers 810, 820, 830 comprises an isolation layer 811, 821, 831, an active region layer 812, 822, 832 over the corresponding isolation layer 811, 821, 831, and a source/drain contact layer 813, 823, 833 over the corresponding active region layer 812, 822, 832. An isolation layer 837 is over the memory array layer 830. The isolation layers 811, 821, 831, 837 are schematically designated in the drawings with the label "Isolation 1." In some embodiments, the isolation layer 811 is omitted, for example, when the substrate 807 is a dielectric substrate.

Each of the active region layer 812, 822, 832 comprises source/drains and channels of transistors of memory elements in the corresponding memory array layer 810, 820, 830. For example, the active region layer 812 comprises source/drains 814, 815 on opposite sides of a channel. The channel is not shown in FIG. 8A, and is described with respect to FIG. 8B. The active region layers 812, 822, 832 and the corresponding source/drains are schematically designated in the drawings with the label "Active region."

Each of the source/drain contact layer 813, 823, 833 comprises source/drain contacts over the corresponding source/drains in the underlying active region layer 812, 822, 832. For example, the source/drain contact layer 813 comprises source/drain contacts 816, 817 over the corresponding source/drains 814, 815. The source/drain contacts 816, 817 are electrically isolated from a corresponding gate electrode by isolation structures 818 on opposite sides of the gate electrode. The isolation structures 818 are schematically designated in the drawings with the label "Isolation 2."

The gate electrode is a common gate electrode for all three transistors stacked upon each other along the Z axis and correspondingly arranged in the memory array layers 810, 820, 830. Two other, similar common gate electrodes are included in the semiconductor device portion 800. The three common gate electrodes are not shown in FIG. 8A, and are described with respect to FIGS. 8E-8F. Gate contacts 834, 835, 836 corresponding to the gate contacts 643 of the semiconductor device 600 are over and in electrical contact with the corresponding common gate electrodes. Each of the gate contacts 834, 835, 836 and the corresponding underlying common gate electrode is sometimes referred to as a gate stack. The gate contacts 834, 835, 836 and the source/drain contacts are schematically designated in the drawings with the label "Conductor." The described arrangement with three gate stacks is an example. Other configurations, where more than three gate stacks are arranged in a column along the Y axis, are within the scopes of various embodiments. In some embodiments, gate contacts 834, 835, 836 are not separately formed elements, but are top portions of the underlying common gate electrodes.

The gate stacks corresponding to the contacts 834, 835, 836 are electrically isolated from each other and from other circuitry in a semiconductor device including the semiconductor device portion 800 by isolation structures 819A-819D corresponding to the isolation structures 619 of the semiconductor device 600. The isolation structures 819A-819D are schematically designated in the drawings with the label "Isolation 3." In some embodiments, two or more of "Isolation 1," "Isolation 2" and "Isolation 3" include different materials. In some embodiments, two or more of "Isolation 1," "Isolation 2" and "Isolation 3" include the same materials.

A memory layer 842 surrounds the channels as described herein, and is arranged, along the X axis, between the isolation layer 837 and the gate contacts 834, 835, 836. The memory layer 842 is schematically designated in the drawings with the label "Memory film."

The source/drain contact 816 in the memory array layer 810 and the overlying source/drain contacts 826, 828 in the memory array layers 820, 830 correspond to three continuously extending bit lines BL1 in the corresponding memory array layers 710, 720, 730 in the semiconductor device 700. The source/drain contact 817 in the memory array layer 810 and the overlying source/drain contacts 827, 829 in the memory array layers 820, 830 correspond to three continuously extending auxiliary lines NC12 in the corresponding memory array layers 710, 720, 730 in the semiconductor device 700. The semiconductor device portion 800 comprises a stepwise structure 840 schematically illustrated in FIG. 8A for electrically coupling the continuously extending bit lines BL1 and auxiliary lines NC12 corresponding to the source/drain contacts 816-817, 826-829 with other circuitry of the semiconductor device including the semiconductor device portion 800. Example configurations of the stepwise structure 840 are described with respect to FIG. 8G.

Figure 8B:
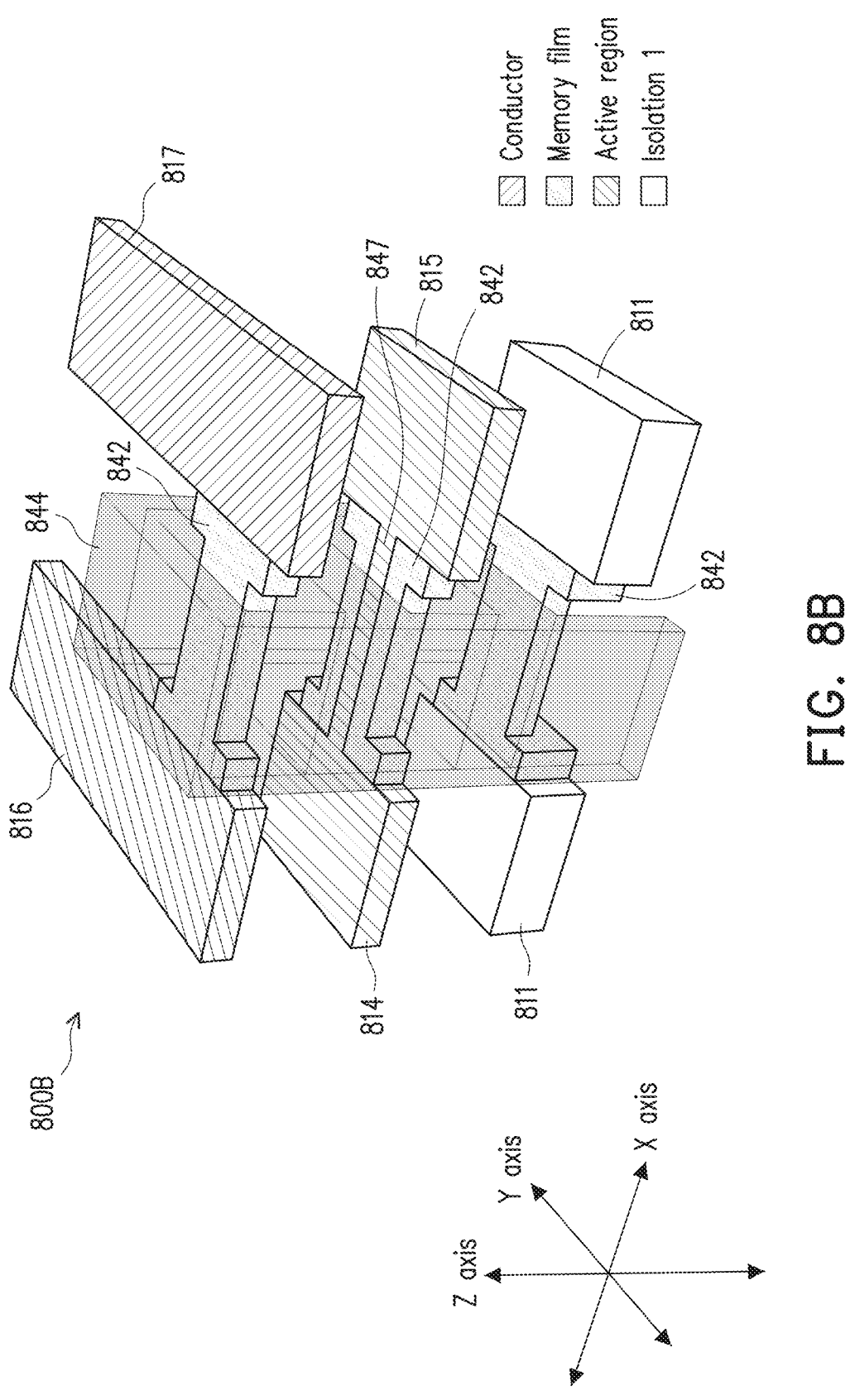
FIG. 8B is a schematic, exploded perspective view of a portion of a semiconductor device, in accordance with some embodiments.

FIG. 8B is a schematic, exploded perspective view of a transistor 800B in the semiconductor device portion 800, in accordance with some embodiments. The transistor 800B corresponds to the transistor having the source/drains 814, 815 and the corresponding source/drain contacts 816, 817 described with respect to FIG. 8A. For simplicity, the isolation structures 818 are omitted in FIG. 8B. Other transistors in the semiconductor device portion 800, or in a semiconductor device including the semiconductor device portion 800, are configured similarly to the transistor 800B.

The transistor 800B comprises a channel 847 extending along the X axis between the source/drains 814, 815 and connecting the source/drains 814, 815. The memory layer 842 extends around the channel 847. A gate electrode 844 extends around the memory layer 842 and the channel 847. This arrangement is sometimes referred to as a gate-all-around (GAA) structure. Although not shown in FIG. 8B, the gate electrode 844 is a common gate electrode that extends further upward along the Z axis and around the channels and memory layer 842 of the other two transistors over the transistor 800B. The gate electrode 844 is schematically designated in the drawings with the label "Gate."

In the example configuration in FIG. 8B, the memory layer 842 comprises a charge storage material. Upon application of a predetermined write voltage across the source/drains 814, 815 and a predetermined turn-ON voltage to the gate electrode 844, positive or negative charges are stored or trapped in the memory layer 842 and change a threshold voltage of the transistor 800B. The threshold voltage of the transistor 800B corresponds to the resistance value of the transistor 800B. In response to different write voltages, different levels or amounts or polarity of charges are stored or trapped in the memory layer, resulting in different resistance values or programed states of the transistor 800B. As described herein, other techniques, materials or principles, such as RRAM, MRAM, or the like, for programming and changing the resistance value of the transistor 800B are within the scopes of various embodiments. Example materials of the memory layer 842 include, but are not limited to, an oxide/nitride/oxide (ONO) multilayer structure including a silicon nitride layer a sandwiched between two silicon oxide layers, a nitride/oxide/nitride (NON) multilayer structure, a multilayer structure including more than three layers of alternating oxide and nitride, SiN, ferromagnetic materials, or the like.

Figures 8C, 8D:
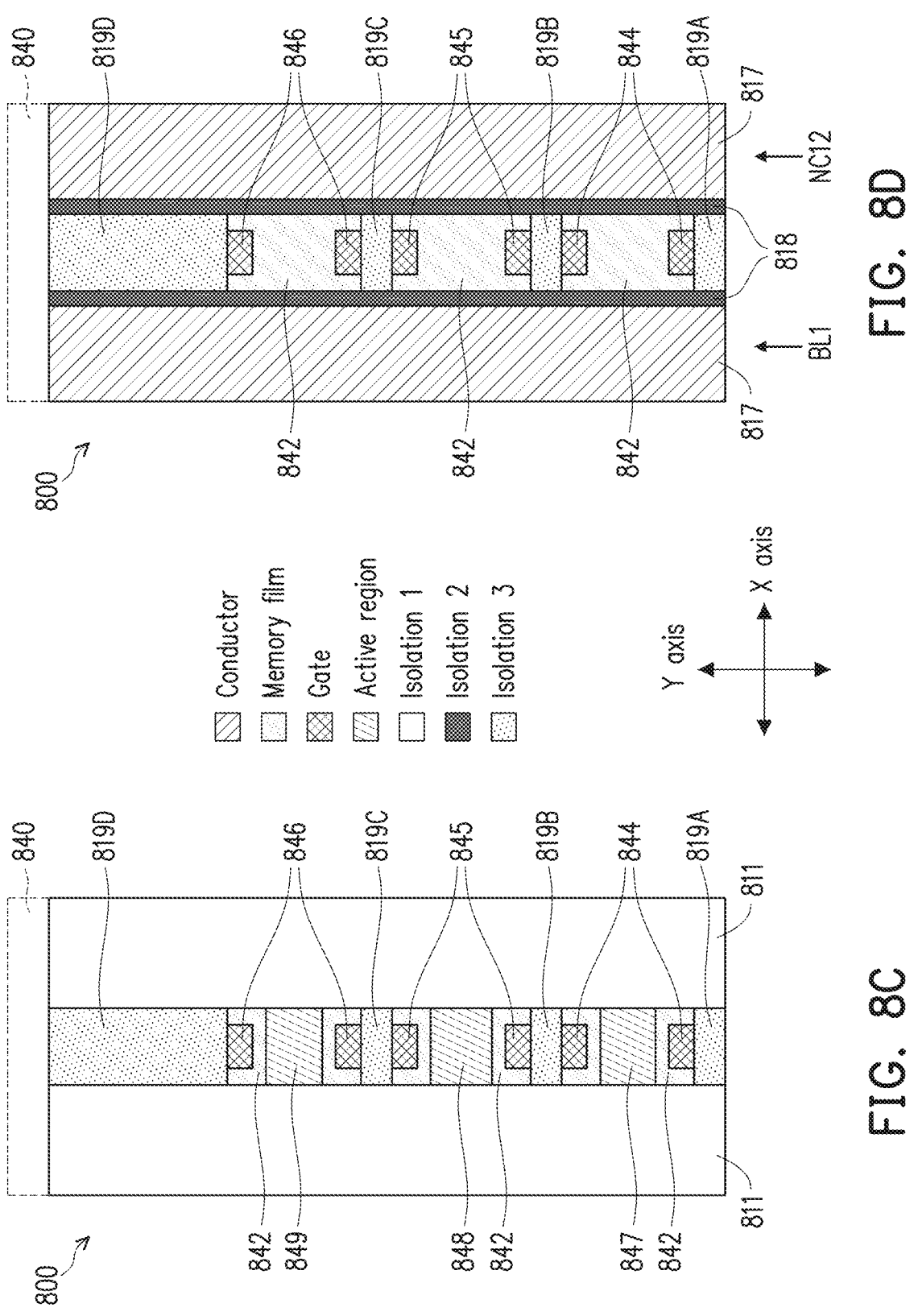
FIG. 8C is a schematic cross-sectional view, taken along plane C in FIG. 8A, of a portion of a semiconductor device, in accordance with some embodiments.
FIG. 8D is a schematic cross-sectional view, taken along plane D in FIG. 8A, of a portion of a semiconductor device, in accordance with some embodiments.

FIG. 8C is a schematic cross-sectional view of the semiconductor device portion 800, taken through the active region layer 812 along plane C in FIG. 8A and seen from above, in accordance with some embodiments.

In FIG. 8C, besides the channel 847 described with respect to FIG. 8B, the active region layer 812 further comprises channels 848, 849 corresponding to the other two gate stacks. For simplicity, the source/drains corresponding to and connected to the channels 848, 849 are omitted in FIG. 8C. The memory layer 842 extends around each of the channels 847, 848, 849. Each of gate electrodes 848, 845, 846 extends around the memory layer 842 that surrounds the corresponding channel 847, 848, 849. The gate electrodes 844, 845 are electrically isolated from each other by the isolation structure 819B. The gate electrodes 845, 846 are electrically isolated from each other by the isolation structure 819C. The gate electrodes 844, 846 are electrically isolated from other circuitry by the isolation structures 819A, 819D.

FIG. 8D is a schematic cross-sectional view of the semiconductor device portion 800, taken through the source/drain contact layer 813 along plane D in FIG. 8A and seen from above, in accordance with some embodiments.

In FIG. 8D, the source/drain contact 816 continuously extends along the Y axis and corresponds to the bit line BL1 in the memory array layer 810. The source/drain contact 816 extends over and in electrical contact with the underlying source/drains of the three transistors having the corresponding channels 847, 848, 849. The source/drain contact 817 continuously extends along the Y axis and corresponds to the auxiliary line NC12 in the memory array layer 810. The source/drain contact 817 extends over and in electrical contact with the other, underlying source/drains of the three transistors having the corresponding channels 847, 848, 849. The source/drain contacts 816, 817 are electrically isolated from the gate electrodes 844, 845, 846 by the isolation structures 818.

Figure 8E:
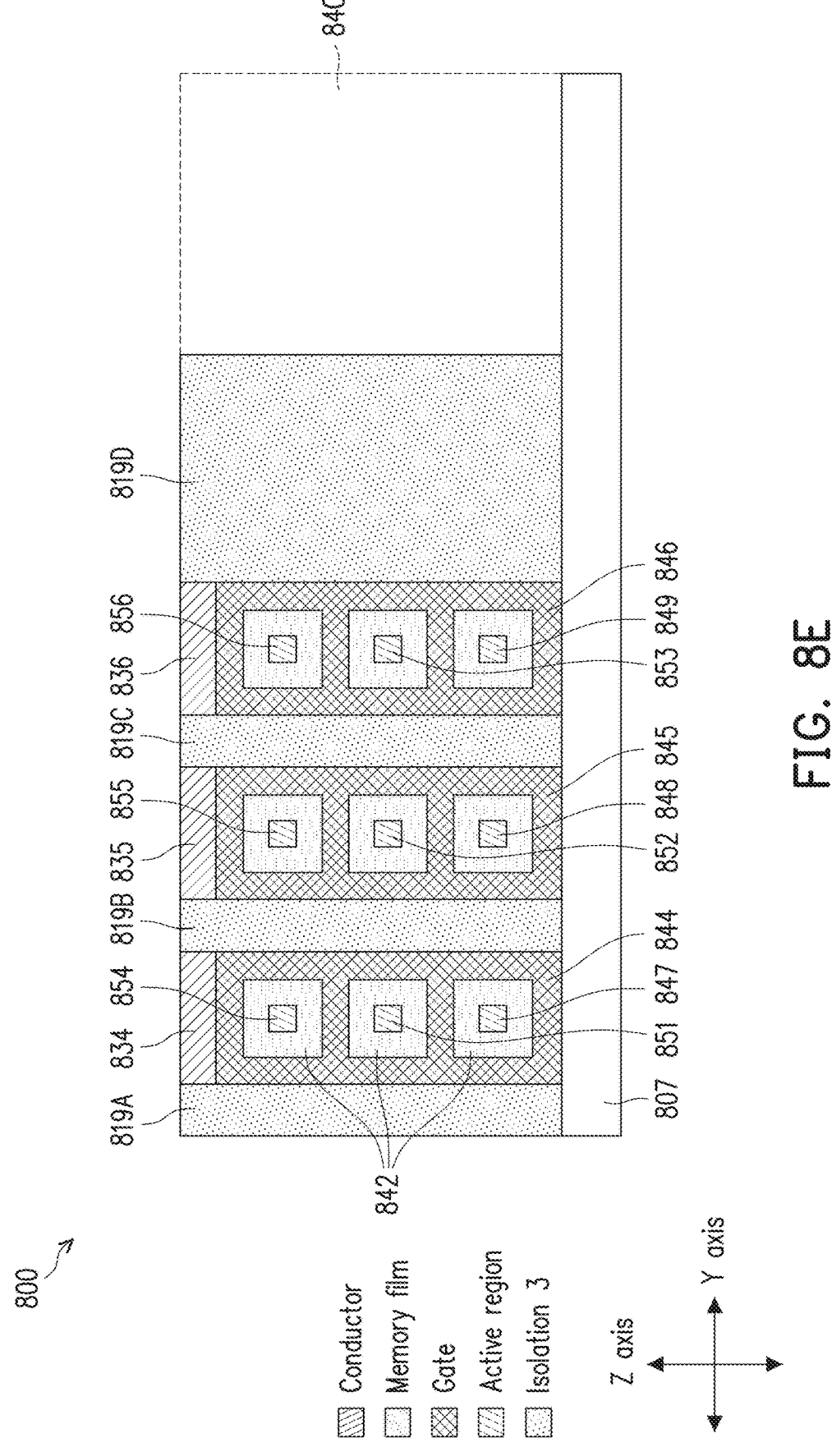
FIG. 8E is a schematic cross-sectional view, taken along plane EF in FIG. 8A, of a portion of a semiconductor device, in accordance with some embodiments.

FIG. 8E is a schematic cross-sectional view of the semiconductor device portion 800, taken through there gate stacks corresponding to the gate contacts 834, 835, 836 along plane EF in FIG. 8A, in accordance with some embodiments.

In FIG. 8E, the active region layer 822 comprises channels 851, 852, 853, and the active region layer 832 comprises channels 854, 855, 856 correspondingly over the channels 847, 848, 849 in the memory array layer 810. The memory layer 842 extends around each of the nine channels shown in FIG. 8E. The gate electrode 844 is a common gate electrode extending around the memory layer 842 that surrounds the stacked channels 847, 851, 854. The gate contact 834 is over and in electrical contact with the gate electrode 844 to form a first gate stack. The gate electrode 845 is a common gate electrode extending around the memory layer 842 that surrounds the stacked channels 848, 852, 855. The gate contact 835 is over and in electrical contact with the gate electrode 845 to form a second gate stack. The gate electrode 846 is a common gate electrode extending around the memory layer 842 that surrounds the stacked channels 849, 853, 856. The gate contact 836 is over and in electrical contact with the gate electrode 846 to form a third gate stack. The gate stacks are electrically isolated from each other and from other circuitry by the isolation structures 819A-819D.

The gate contacts 834, 835, 836 are configured to be electrically coupled with corresponding word lines, e.g., word lines WL0, WL2, WL4 in FIG. 7, through corresponding via structures, e.g., via structures 622, 626, 628 in FIG. 7. In this arrangement, the word lines are over the gate stacks.

Figure 8F:
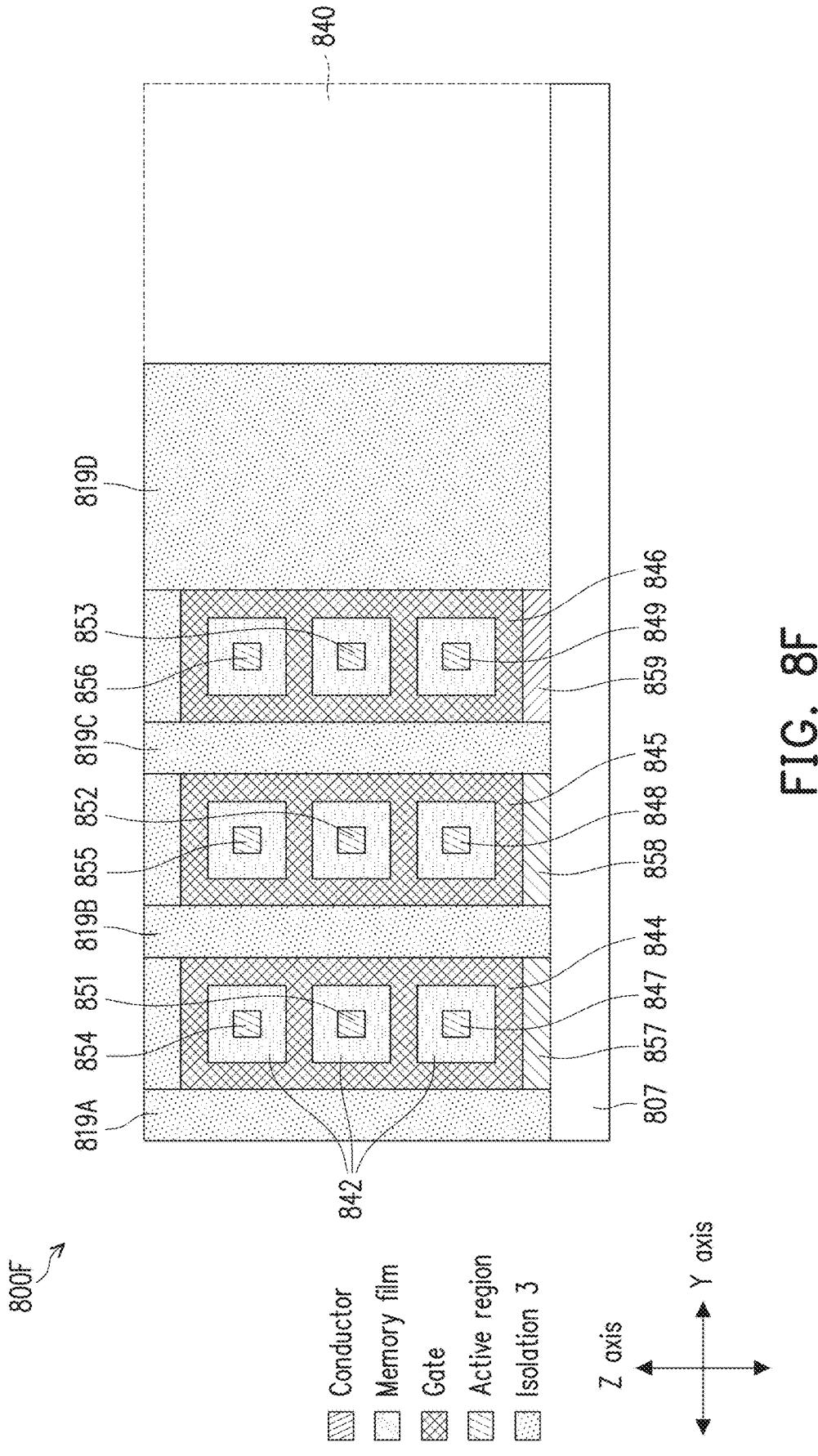
FIG. 8F is a schematic cross-sectional view, taken along plane EF in FIG. 8A, of a portion of a semiconductor device, in accordance with some embodiments.

FIG. 8F is a schematic cross-sectional view similar to FIG. 8E, in accordance with some embodiments.

The configuration of a semiconductor device portion 800F in FIG. 8F is an alternative to the configuration of the semiconductor device portion 800 in FIG. 8E. As described herein, in the configuration in FIG. 8E, the word lines are over the gate stacks. In the configuration in FIG. 8F, the word lines are under the gate stacks. Otherwise, the semiconductor device portion 800F is similar to the semiconductor device portion 800. Specifically, the semiconductor device portion 800F comprises word lines 857, 858, 859 which extends along the X axis, and are under and in electrical contact with the corresponding gate electrodes 844, 845, 846. The word lines 857, 858, 859 are sometimes referred to as "bottom word lines." In a manufacturing process for fabricating the semiconductor device portion 800F, a conductive layer is deposited over the substrate 807, and then patterned to form the bottom word lines 857, 858, 859. The memory array layers 810, 820, 830 are next sequentially deposited over the bottom word lines 857, 858, 859, and further manufacturing processes are performed as described herein, to form the gate stacks over and in electrical contact with the bottom word lines 857, 858, 859 already formed over the substrate 807. In some embodiments, the conductive layer for forming the bottom word lines 857, 858, 859 is deposited by chemical vapor deposition (CVD), physical vapor deposition (PVD), plating, or combinations thereof. Example materials of the conductive layer for forming the bottom word lines 857, 858, 859 include, but are not limited to, polysilicon, Al, Cu, or the like.

While the semiconductor device portion 800 in FIG. 8E includes word lines over the gate stacks and the semiconductor device portion 800F in FIG. 8F includes word lines under the gate stacks, other configurations are within the scopes of various embodiments. For example, as described herein with respect to FIG. 12B, in one or more embodiments, a semiconductor device corresponding to the memory device 100 or 500 comprises a mixed configuration having both word lines over the gate stacks and word lines under the gate stacks.

Figure 8G:
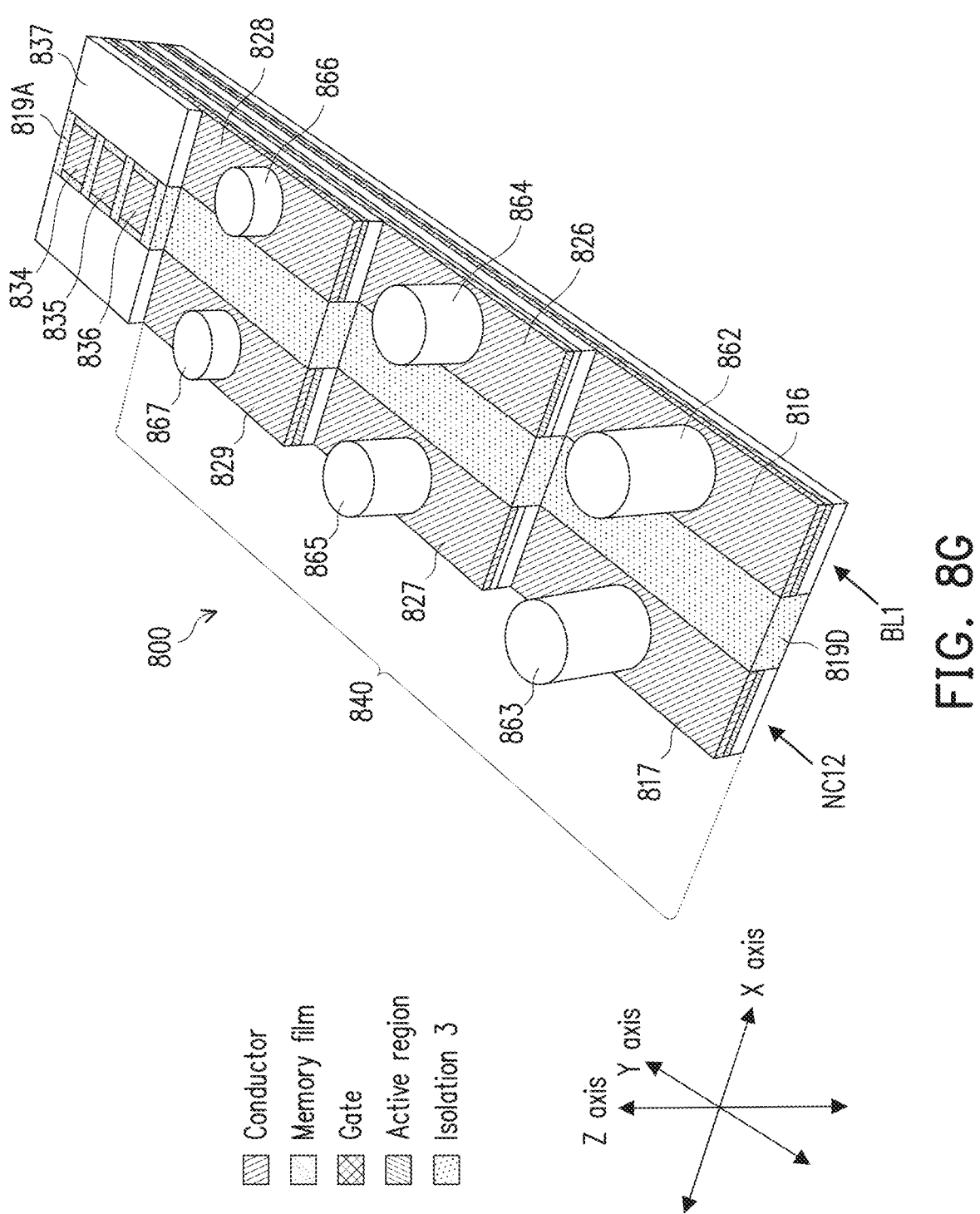
FIG. 8G is a schematic perspective view of a portion of a semiconductor device, in accordance with some embodiments.

FIG. 8G is a schematic perspective view of the semiconductor device portion 800, in accordance with some embodiments. The view in FIG. 8G is seen along the Y axis in a direction opposite to that of FIG. 8A. For simplicity, the isolation structures 818 are omitted in FIG. 8G.

In FIG. 8G, the stepwise structure 840 is shown in detail. The stepwise structure 840 comprises several steps corresponding to the continuously extending bit lines BL1 and auxiliary lines NC12 in the memory array layers 810, 820, 830. For example, a first and bottom step corresponds to the continuously extending bit line BL1 or source/drain contact 816 and auxiliary lines NC12 or source/drain contact 817 in the memory array layer 810. A second and middle step corresponds to the continuously extending bit line BL1 or source/drain contact 826 and auxiliary lines NC12 or source/drain contact 827 in the memory array layer 820. A third and top step corresponds to the continuously extending bit line BL1 or source/drain contact 828 and auxiliary lines NC12 or source/drain contact 829 in the memory array layer 830. The source/drain contacts 828, 829 in the top step have a smallest dimension along the Y axis, and are correspondingly coupled to via structures 866, 867. The source/drain contacts 826, 827 in the middle step have a middle dimension along the Y axis, protrude from the top step, and are correspondingly coupled to via structures 864, 865. The source/drain contacts 816, 817 in the bottom step have a longest dimension along the Y axis, protrude from the middle step, and are correspondingly coupled to via structures 862, 863.

The via structures 862, 864, 866 have different heights along the Z axis. For example, the via structure 862 coupled to the source/drain contact 816 at the bottom step has a height greater than the via structure 864 coupled to the source/drain contact 826 at the middle step, and the via structure 864 has a height greater than the via structure 866 coupled to the source/drain contact 828 at the top step. The top surfaces of the via structures 862, 864, 866 are co-planar, in one or more embodiments. As a result, it is possible to form conductive lines in the same metal layer and correspondingly coupled to the via structures 862, 864, 866 for separately coupling the bit lines BL1 in the different memory array layers 810, 820, 830 to other circuitry.

The via structures 863, 865, 867 have different heights long the Z axis. For example, the via structure 866 coupled to the source/drain contact 817 at the bottom step has a height greater than the via structure 865 coupled to the source/drain contact 827 at the middle step, and the via structure 865 has a height greater than the via structure 867 coupled to the source/drain contact 829 at the top step. The top surfaces of the via structures 863, 865, 867 are co-planar, in one or more embodiments. As a result, it is possible to form conductive lines in the same metal layer and correspondingly coupled to the via structures 863, 865, 867 for separately coupling the auxiliary line NC12 in the different memory array layers 810, 820, 830 to other circuitry. In some embodiments, the top surfaces of the via structures 862, 864, 866 and the top surfaces of the via structures 863, 865, 867 are co-planar, and the conductive lines coupled to the bit lines BL1 and the auxiliary lines NC12 are all arranged in the same metal layer. In one or more embodiments, the top surfaces of the via structures 862, 864, 866 are arranged in a plane different from a plane containing the top surfaces of the via structures 863, 865, 867. As a result, the conductive lines coupled to the bit lines BL1 are arranged in a metal layer, and the conductive lines coupled to auxiliary lines NC12 are arranged in a different metal layer. In at least one embodiment, one or more advantages described herein are achievable in the semiconductor device portion 800, the semiconductor device portion 800F, or a semiconductor device including the semiconductor device portion 800 or 800F.

Figure 9:
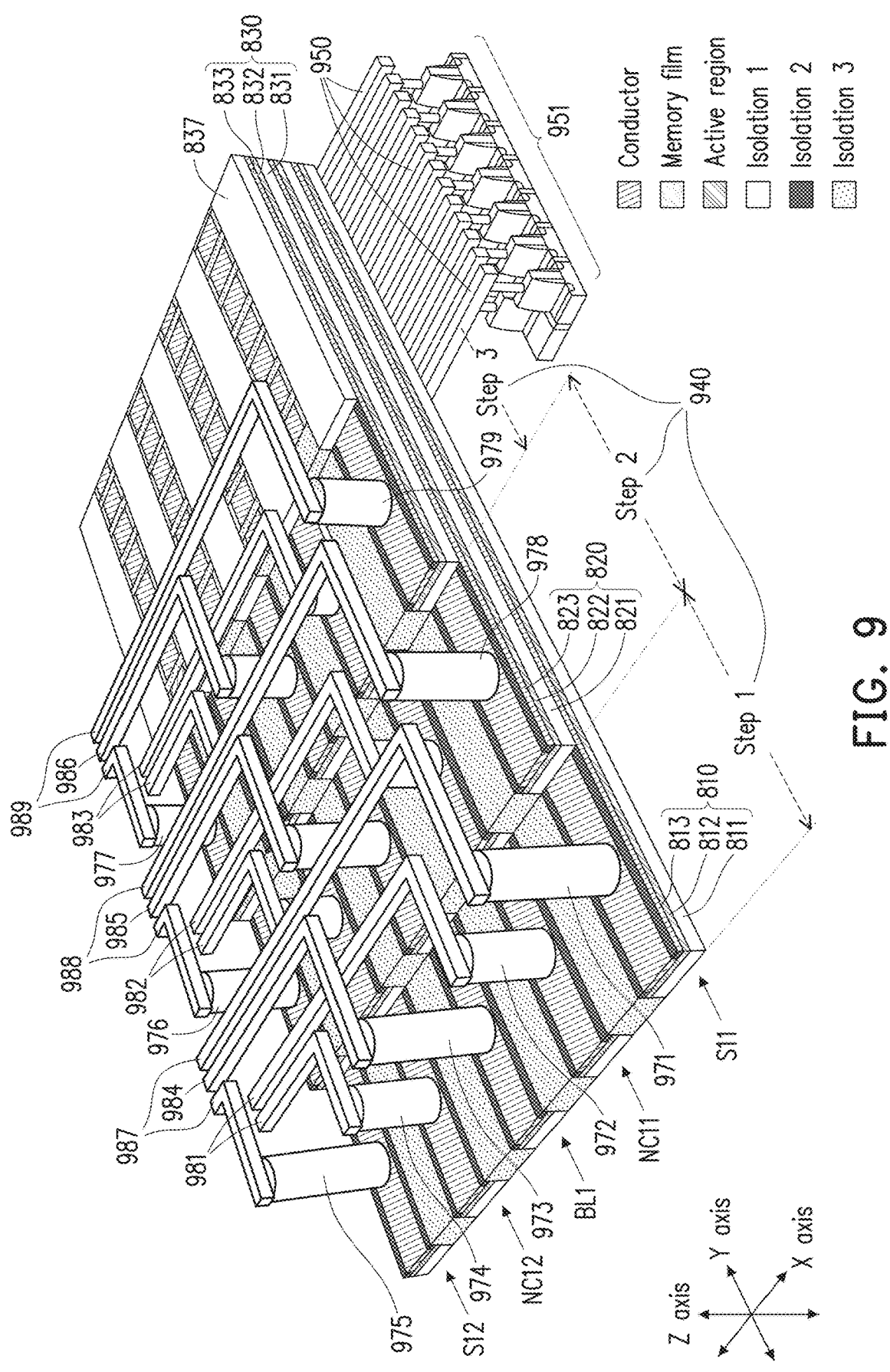
FIG. 9 is a schematic perspective view of a semiconductor device, in accordance with some embodiments.

FIG. 9 is a schematic perspective view of a semiconductor device 900, in accordance with some embodiments. In at least one embodiment, the semiconductor device 900 includes various features that correspond to one or more of the memory device 500, the semiconductor device 700, the semiconductor device portion 800 and the semiconductor device portion 800F. Components in FIG. 9 having corresponding components in FIG. 7 are designated by the same reference numerals of FIG. 7. Components in FIG. 9 having corresponding components in FIGS. 8A-8G are designated by the same reference numerals of FIGS. 8A-8G.

The semiconductor device 900 comprises memory array layers 810, 820, 830 stacked one upon another over a substrate (not shown). In at least one embodiment, the substrate corresponds to the substrate 807. The semiconductor device 900 further comprises a plurality of bottom word lines 950 arranged under the memory array layers 810, 820, 830 but over the substrate, in a manner similar to the semiconductor device portion 800F described with respect to FIG. 8F. The bottom word lines 950 are electrically coupled to the common gate electrodes of various gate stacks in the memory array layers 810, 820, 830, and are also electrically coupled to a peripheral circuit 951 to receive address signals of the memory elements and/or memory cells to be assessed in the memory array layers 810, 820, 830.

In some embodiments, a plurality of source lines (not shown) are arranged over the memory array layers 810, 820, 830 and are electrically coupled to the memory elements or transistors in the memory array layers 810, 820, 830 by via structures, as described with respect to FIG. 7.

The semiconductor device 900 further comprises a stepwise structure 940 corresponding to the stepwise structure 840, and configured to couple various bit lines BL and auxiliary lines NC to other circuitry. The bit lines BL and auxiliary lines NC on the steps 1-3 of the stepwise structure 940 are electrically coupled to corresponding via structures and conductive lines on one or more metal layers over the stepwise structure 940. For example, the auxiliary lines NC on the steps of the stepwise structure 940 are electrically coupled to via structures exemplarily indicated at 972, 974, and then to conductive lines 981, 982, 983 in a first metal layer over the stepwise structure 940. The bit lines BL on the steps of the stepwise structure 940 are electrically coupled to via structures exemplarily indicated at 971, 973, 975-979, and then to conductive lines 984-989 in a second metal layer over the stepwise structure 940. In the example configuration in FIG. 9, the first metal layer for routing the auxiliary lines NC is different from the second metal layer for routing the bit lines BL. For example, the first metal layer for routing the auxiliary lines NC is below the second metal layer for routing the bit lines BL.

In some embodiments, the conductors on the steps of the stepwise structure 940 along the columns indicated as S11, S12 are already electrically coupled to corresponding source lines (not shown) over the memory array layers 810, 820, 830. As a result, the corresponding via structures 971, 975-979 and conductive lines 987-989 are omitted.

In at least one embodiment, one or more advantages described herein are achievable in the semiconductor device 900.

FIGS. 10A-10H are schematic perspective views of a semiconductor device 1000 at various stages during manufacture, in accordance with some embodiments. In some embodiments, the semiconductor device 1000 corresponds to the semiconductor device portion 800. Unless otherwise described, components in FIGS. 10A-10H having corresponding components in FIGS. 8A-8G are designated by the reference numerals of FIGS. 8A-8G increased by 200.

Figures 10A, 10B:
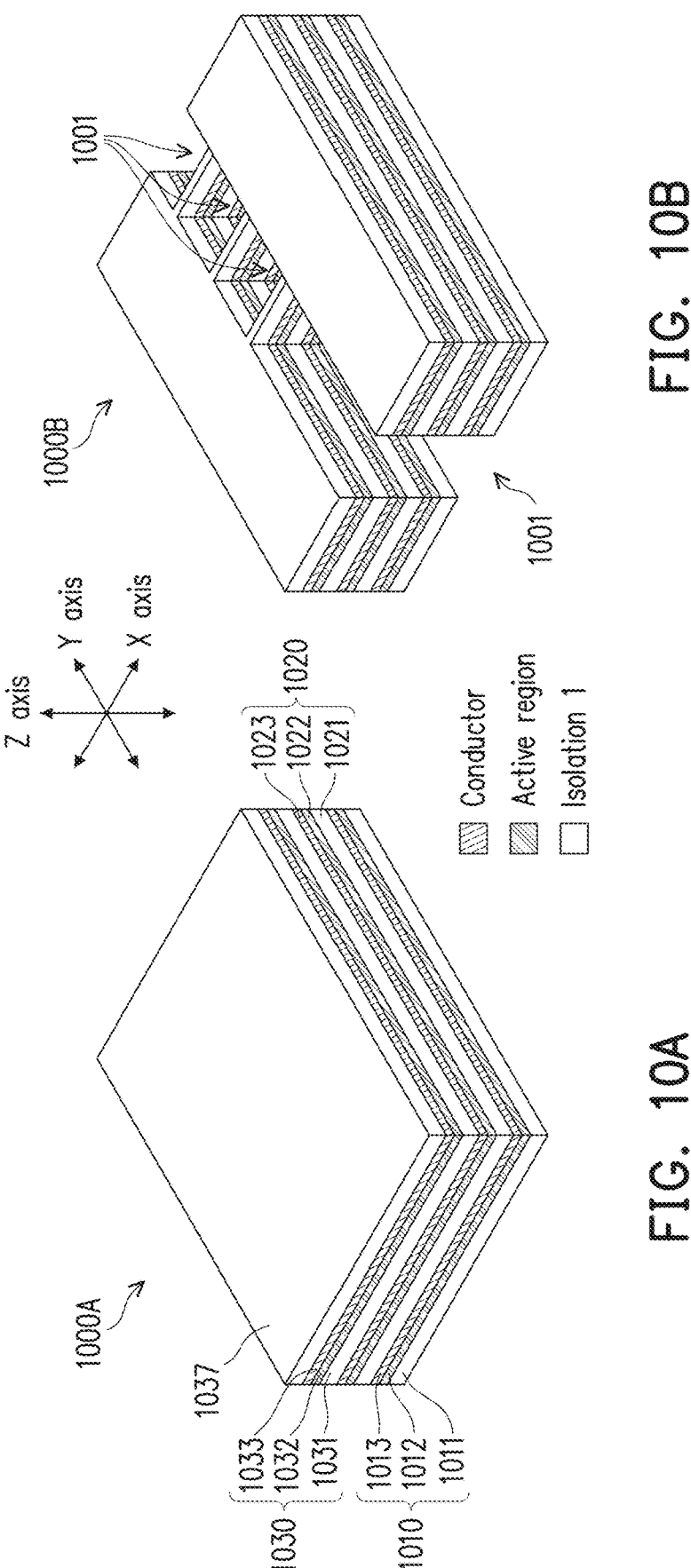
FIGS. 10A-10H are schematic perspective views of a semiconductor device at various stages during manufacture, in accordance with some embodiments.

At the stage in FIG. 10A, a plurality of memory array layers 1010, 1020, 1030 are sequentially deposited over a substrate (not shown). In some embodiments, the substrate corresponds to the substrate 807, and comprises a dielectric substrate, a semiconductor wafer, a semiconductor-on-insulator (SOI) wafer or an epitaxial wafer. The semiconductor wafer, the SOI wafer or the epitaxial wafer comprises, in one or more embodiments, an elemental semiconductor material or a compound semiconductor material. Examples of the elemental semiconductor include, but are not limited to, Si or Ge. Examples of the compound semiconductor include, but are not limited to, SiGe, SiC, SiGeC, a III-V semiconductor or a II-VI semiconductor.

An isolation layer 1011 of the memory array layer 1010 is deposited over the substrate by one or more of thermal growth, CVD, spin coating, or the like. Example materials of the isolation layer 1011 include, but are not limited to, silicon oxide, silicon nitride, polymer or combinations thereof. In some embodiments, the isolation layer 1011 is a single layer. In one or more embodiments, the isolation layer 1011 comprises a multilayer structure.

An active region layer 1012 of the memory array layer 1010 is deposited over the isolation layer 1011 by one or more of CVD, epitaxial growth, or the like. Example materials of the active region layer 1012 include, but are not limited to, doped or intrinsic semiconductor material, such as polysilicon, SiGe, SiC or the like.

A source/drain contact layer 1013 of the memory array layer 1010 is deposited over the active region layer 1012 by one or more of CVD, PVD, sputtering, electroplating, electro-less plating, or the like. Example materials of the source/drain contact layer 1013 include, but are not limited to, polysilicon, metal such as Al, Cu, or the like.

The process is then repeated to sequentially deposit, over the source/drain contact layer 1013, an isolation layer 1021, an active region layer 1022 and a source/drain contact layer 1023 of the memory array layer 1020, and then an isolation layer 1031, an active region layer 1032 and a source/drain contact layer 1033 of the memory array layer 1030. An isolation layer 1037 is next deposited over the source/drain contact layer 1033 of the memory array layer 1030, to obtain a structure 1000A.

At the stage in FIG. 10B, the structure 1000A is etched to form holes or openings 1001 which extend through an entire thickness of the structure 1000A. Example etching processes include, but are not limited to, anisotropic etching, isotropic etching, wet etching, dry etching, or the like. In some embodiments, a single etching process is performed. In one or more embodiments, multiple etching processes are performed each to remove a portion of the structure 1000A. As a result, a structure 1000B having the holes or openings 1001 is obtained.

Figures 10C, 10D:
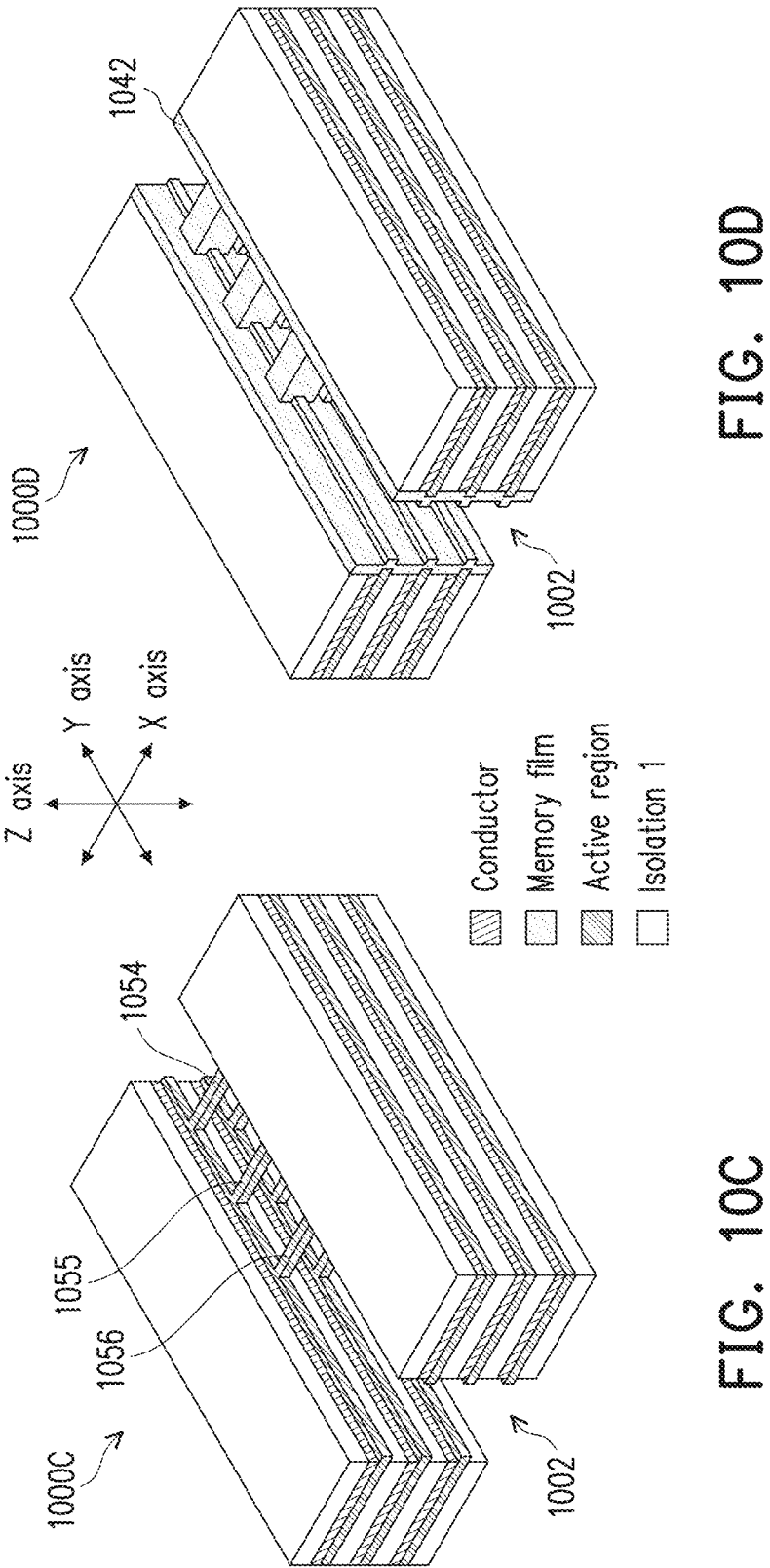

At the stage in FIG. 10C, the structure 1000B is selectively etched to remove portions of the isolation layers 1011, 1021, 1031, 1037 and source/drain contact layers 1013, 1023, 1033 which are exposed by the holes or openings 1001. The etch selectivity is chosen so that the active region layers 1012, 1022, 1032 exposed by the holes or openings 1001 are not removed, or substantially not removed, by the selective etching process. Example etching processes include, but are not limited to, anisotropic etching, isotropic etching, wet etching, dry etching, or the like. In some embodiments, a single etching process is performed. In one or more embodiments, multiple etching processes are performed. As a result, a structure 1000C is obtained. In the structure 1000C, the holes or openings 1001 of the structure 1000B are connected with each other and become a hole or opening 1002. Further, various channels in all memory array layers 1010, 1020, 1030 are exposed, as exemplarily indicated at 1054, 1055, 1056.

At the stage in FIG. 10D, a memory layer 1042 is deposited on exposed walls of the hole or opening 1002, and also around the exposed channels in the structure 1000C. Example materials of the memory layer 1042 include, but are not limited to, ONO, NON, a multilayer structure including more than three layers of alternating oxide and nitride, SiN, ferromagnetic materials, or the like. Example depositing processes include, but are not limited to, atomic layer deposition (ALD), CVD, or combinations thereof. As a result, a structure 1000D is obtained. The hole or opening 1002 substantially remains in the structure 1000D.

Figures 10E, 10F:
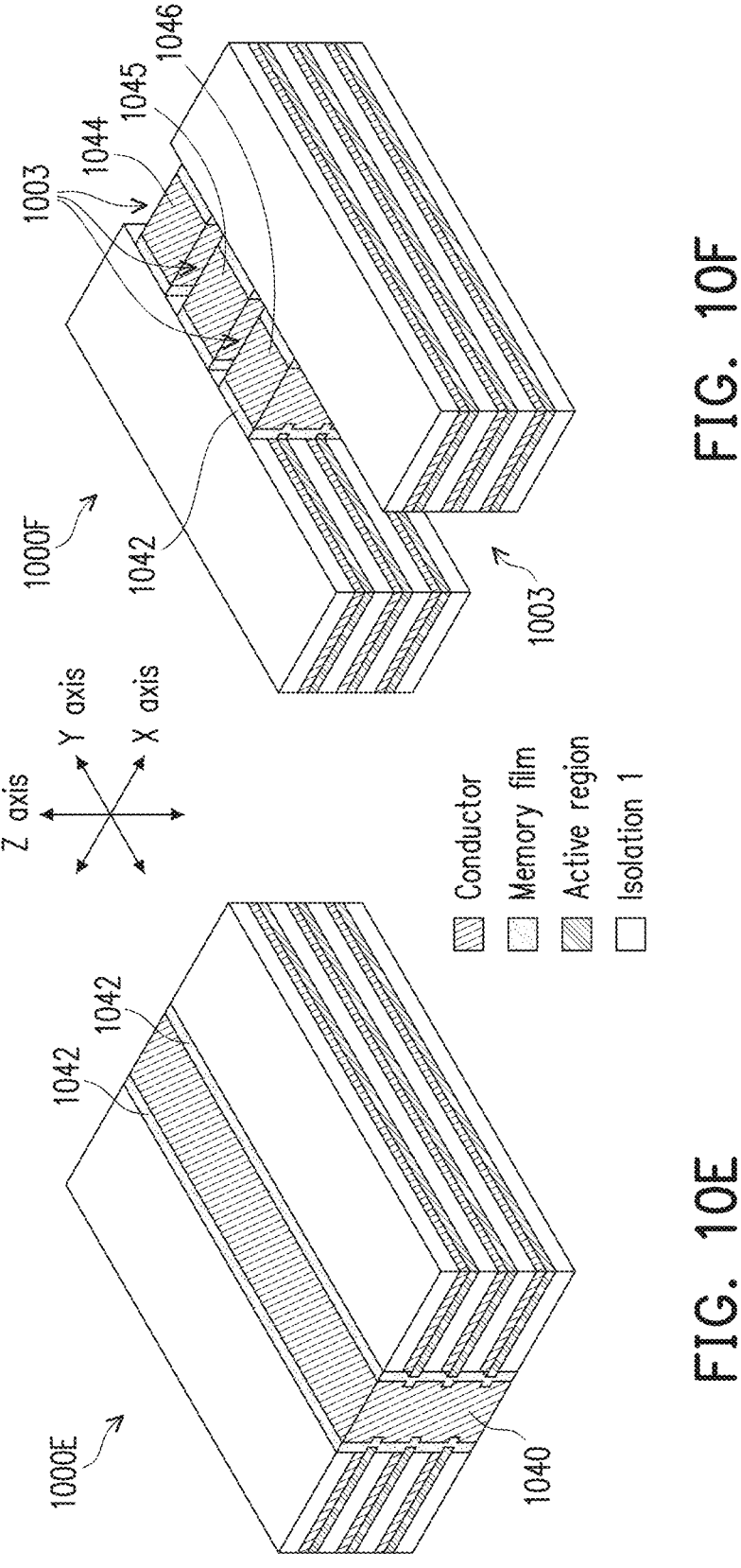

At the stage in FIG. 10E, a conductive material 1040 for gate electrodes is deposited to fill the hole or opening 1002 in the structure 1000D, by one or more of CVD, PVD, sputtering, ALD, or the like. Example conductive materials for gate electrodes include, but are not limited to, metals, such as Al, W, or the like, or combinations thereof. The conductive material 1040 extend around the memory layer 1042 that surrounds the channels. As a result, a structure 1000E is obtained. In some embodiments, the following process is performed to fabricate the structure 1000E from the structure 1000C without the intermediate structure 1000D. For example, the memory layer 1042 is deposited on exposed walls of the hole or opening 1002, around the exposed channels, and over the top of the structure 1000C. Then, the conductive material 1040 for gate electrodes is deposited to overfill the hole or opening 1002, and also over the memory layer 1042 at the top of the structure. A subsequent planarization process, e.g., a chemical mechanical polishing (CMP) process, is performed to remove excess portions of the conductive material 1040 and the memory layer 1042 from the top of the structure, thereby obtaining the structure 1000E.

At the stage in FIG. 10F, portions of the conductive material 1040 are removed, e.g., by etching, to form holes or openings 1003. The remaining portions of the conductive material 1040 form gate electrodes 1044, 1045, 1046 each being a common gate electrode for three stacked transistors correspondingly in the memory array layers 1010, 1020, 1030. As a result, a structure 1000F is obtained.

Figure 10G:
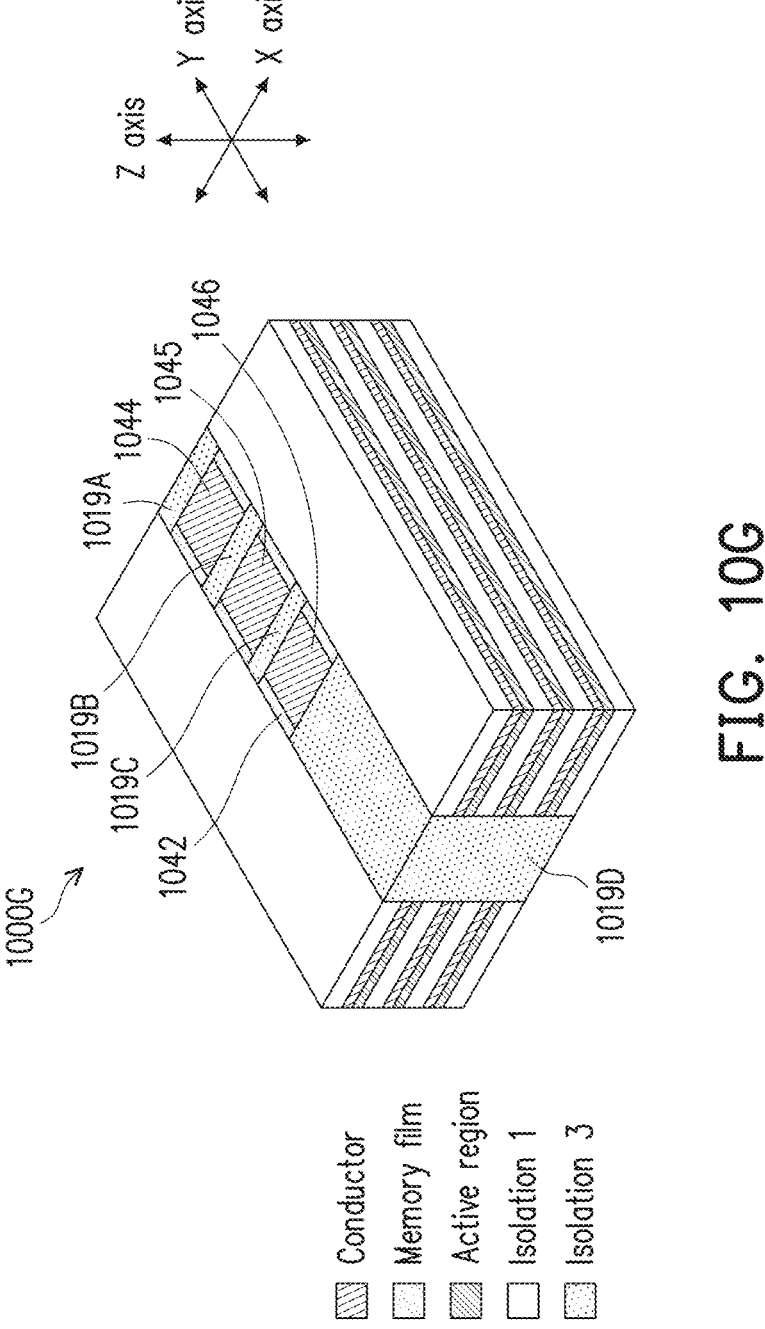

At the stage in FIG. 10G, an insulating material is deposited to fill in the holes or openings 1003 in the structure 1000F, thereby forming isolation structures 1019A-1019D. An example depositing process includes, but is not limited to, CVD. Example insulating materials include, but are not limited to, silicon oxide, silicon nitride, or the like, or combinations thereof. As a result, a structure 1000G is obtained.

Figure 10H:
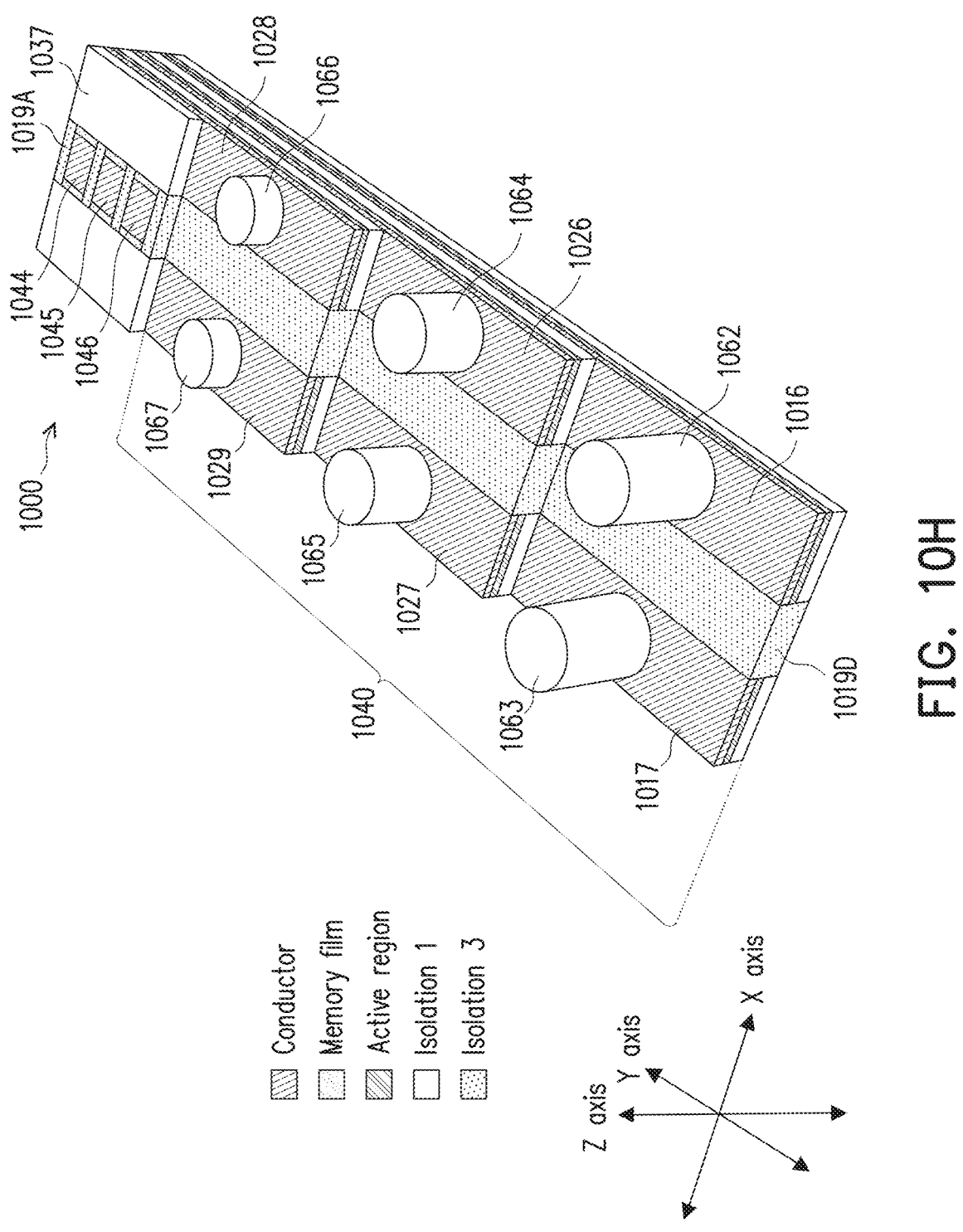

At the stage in FIG. 10H, a stepwise structure 1040 is formed in a peripheral region outside the memory arrays in the memory array layers 1010, 1020, 1030. For simplicity, the peripheral region is omitted in FIGS. 10A-10G. For example, portions of the isolation layer 1037 and the memory array layers 1020, 1030 in the peripheral region are patterned, e.g., by etching, to expose source/drain contacts 1016, 1017 in the memory array layer 1010, thereby forming a first, bottom step of the stepwise structure 1040. Next, portions of the isolation layer 1037 and the memory array layer 1030 in the peripheral region are further patterned, e.g., by etching, to expose source/drain contacts 1026, 1027 in the memory array layer 1020, thereby forming a second, middle step of the stepwise structure 1040. Next, portions of the isolation layer 1037 in the peripheral region are further patterned, e.g., by etching, to expose source/drain contacts 1028, 1029 in the memory array layer 1030, thereby forming a third, top step of the stepwise structure 1040. Via structures 1062-1067 are next formed over and in electrical contact with the corresponding source/drain contacts 1016, 1017, 1026-1029. For example, a dielectric layer is deposited over the stepwise structure 1040, and via holes having different heights and corresponding to the via structures 1062-1067 are formed in multiple etching operations, and then filled with a conductive material, e.g., a metal, to form the via structures 1062-1067. In at least one embodiment, the via holes having different heights and corresponding to the via structures 1062-1067 are simultaneously formed in an etching operation. For example, an etch selectivity between the dielectric material of the dielectric layer and a conductive material of the source/drain contacts 1016, 1017, 1026-1029 is high, making it possible to form the via holes by a highly selective etching operation with which the high-selectivity etching is stopped reliably on the source/drain contacts 1016, 1017, 1026-1029. The semiconductor device 1000 is obtained, as shown in FIG. 10H. Other processes, e.g., for forming conductive lines coupled to the via structures 1062-1067, via structures for coupling the memory elements in the memory array to source lines and word lines, or the like, are performed in one or more embodiments. In at least one embodiment, one or more advantages described herein are achievable in the semiconductor device 1000.

Figure 11:
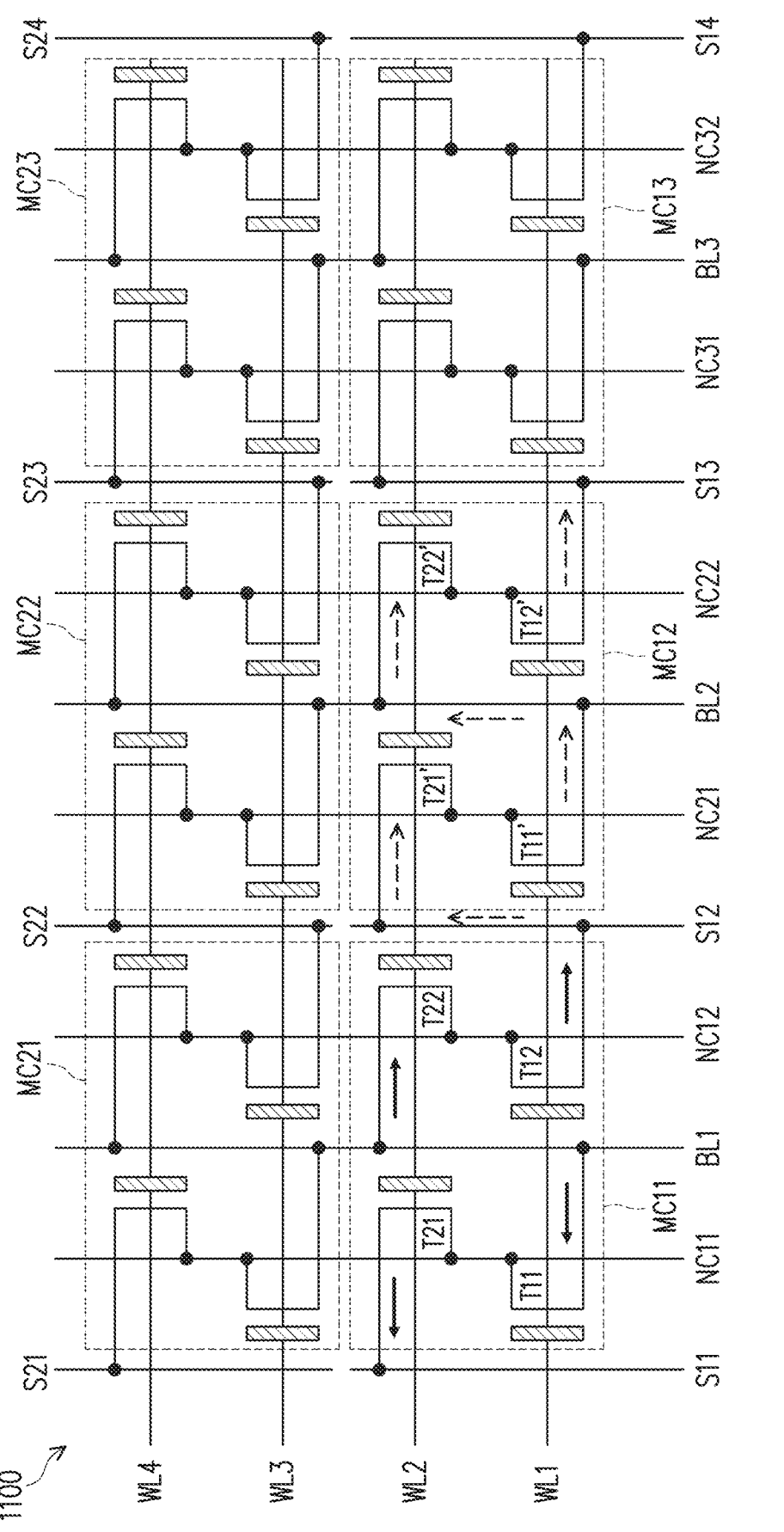
FIG. 11 is a schematic circuit diagram of a memory device, in accordance with some embodiments.

FIG. 11 is a schematic circuit diagram of a memory device 1100, in accordance with some embodiments. In at least one embodiment, the memory device 500 corresponds to a portion of the memory device 1100. Corresponding elements in FIG. 5, and FIG. 11 are designated by the same reference numerals. For simplicity, source lines SL1, SL2, SL3 are omitted in FIG. 11.

The memory device 1100 comprises memory cells MC11, MC12, MC21, MC22 of the memory device 500. The memory device 1100 further comprises memory cells MC13, MC23. The electrical circuits inside and between the memory cells MC11, MC12, MC21, MC22 are the same in FIG. 5 and FIG. 11. The memory cell MC13 is configured similarly to the memory cell MC11. The memory cell MC13 is coupled to and arranged with respect to the conductor S13, the auxiliary line NC31, the bit line BL3, the auxiliary line NC32 and the conductor S14 in a manner similar to how the memory cell MC11 is coupled to and arranged with respect to the conductor S11, the auxiliary line NC11, the bit line BL1, the auxiliary line NC12 and the conductor S12. The conductor S14 is electrically coupled of the source line SL1. Further, the memory cell MC13 is coupled to and arranged with respect to the word lines WL1, WL2 in a manner similar to how the memory cell MC11 is coupled to and arranged with respect to the word lines WL1, WL2. The memory cell MC23 is configured similarly to the memory cell MC21. The memory cell MC23 is coupled to and arranged with respect to the conductor S23, the auxiliary line NC31, the bit line BL3, the auxiliary line NC32 and the conductor S24 in a manner similar to how the memory cell MC21 is coupled to and arranged with respect to the conductor S21, the auxiliary line NC11, the bit line BL1, the auxiliary line NC12 and the conductor S22. The conductor S24 is electrically coupled of the source line SL2. Further, the memory cell MC23 is coupled to and arranged with respect to the word lines WL3, WL4 in a manner similar to how the memory cell MC21 is coupled to and arranged with respect to the word lines WL3, WL4.

Although one or more advantages described herein are achievable in the memory device 1100 in accordance with one or more embodiments, sneak current during a read operation is a potential concern in some situations. For example, in a read operation of the memory cell MC11, a turn-ON voltage is applied to the word lines WL1, WL2, which turn ON not only the transistors of the selected memory cell MC11, but also the corresponding transistors of the non-selected memory cells MC12, MC13. A read voltage is applied across the source line SL1 (which is electrically coupled to conductors S11, S12, S13, S14) and bit line BL1 of the selected memory cell MC11. The other bit lines BL2, BL3, the other source lines SL2, SL3 are grounded and/or left floating. All auxiliary lines NC are left floating. The read voltage causes a read current (shown by solid-line arrows in FIG. 11) to flow, for example, from the bit line BL1, through the turned ON transistors T11, T21 in one memory string and also through the turned ON transistors T12, T22 in the other memory string to the source line SL1 through the conductors S11, S12. The read current is detected by a controller to detect the total resistance value or programed state of the memory cell MC11, as described herein.

However, in some situations, a part of the read current does not flow directly from the conductor S12 to the source line SL1, but instead flows as a sneak current (shown by dot-dot arrows in FIG. 11) along the conductor S12, through the turned ON transistors T21', T11' of the memory cell MC12 to the bit line BL2. In situations where the bit line BL2, as a non-selected bit line, is grounded during the read operation of the memory cell MC11, the sneak current sinks at the bit line BL2. In situations where the bit line BL2, as a non-selected bit line, is left floating during the read operation of the memory cell MC11, the sneak current further flows through the turned ON transistors T22', T12' of the memory cell MC12 to the conductor S13. The sneak current reduces the read current and potentially causes incorrect detection of the programed state of the memory cell MC11 in some situations. This is a consideration which is addressed in one or more embodiments by configurations described with respect to FIGS. 12A-12B.

Figure 12A:
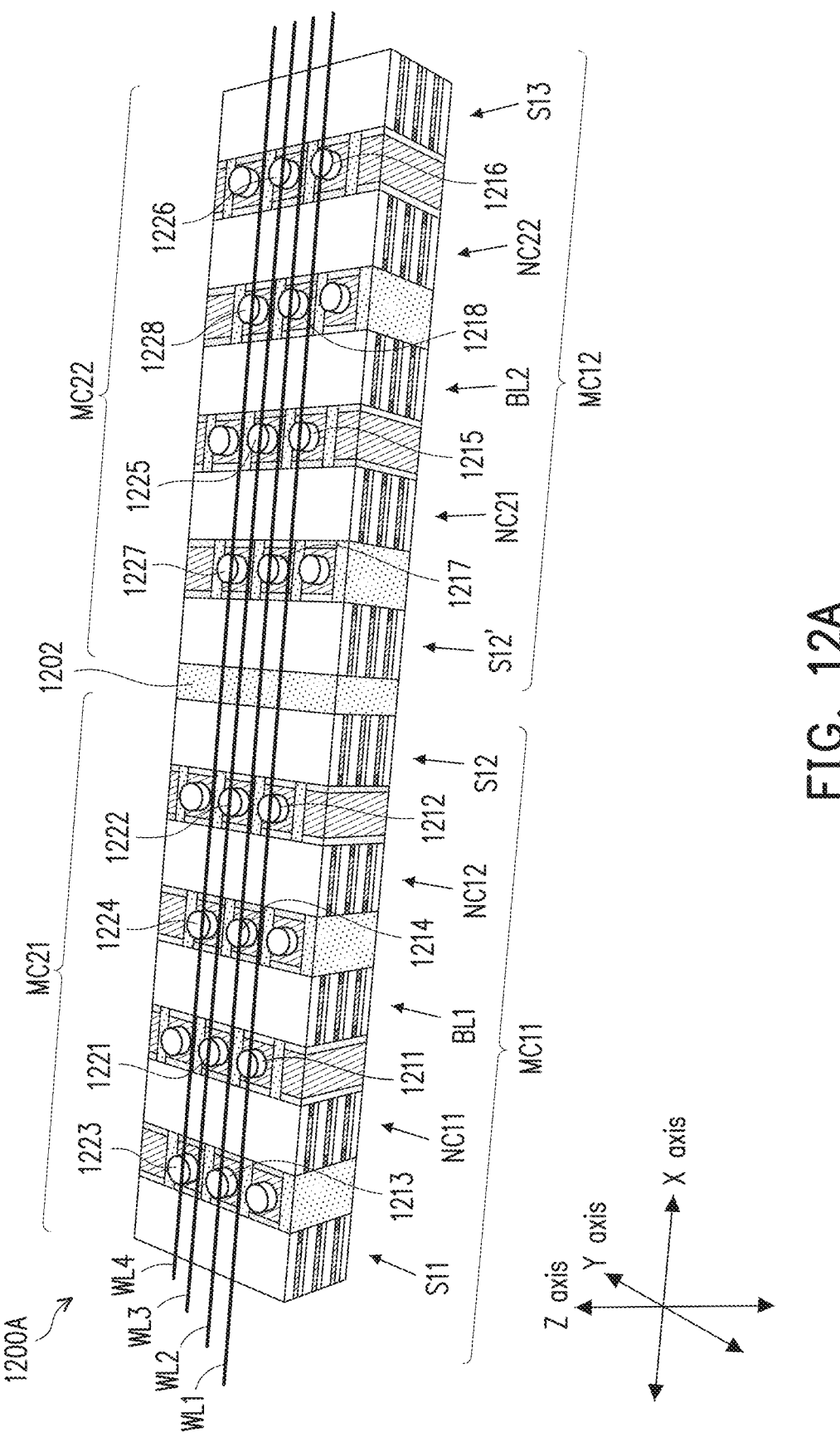
FIG. 12A is a schematic perspective view of a semiconductor device, in accordance with some embodiments.

FIG. 12A is a schematic perspective view of a semiconductor device 1200A, in accordance with some embodiments. In at least one embodiment, the semiconductor device 1200A corresponds to a portion of the memory device 1100. Corresponding elements in FIG. 11 and FIG. 12A are designated by the same reference numerals.

In the semiconductor device 1200A in FIG. 12A, portions corresponding to the memory cells MC11, MC12, MC21, MC22 are designated by labels MC11, MC12, MC21, MC22. The word line WL1 is electrically coupled to the gates of the corresponding transistors T11, T12 in the memory cell MC11 and transistors T11', T12' in the memory cell MC12 by via structures 1211, 1212, 1215, 1216. The word line WL2 is electrically coupled to the gates of the corresponding transistors T21, T22 in the memory cell MC11 and transistors T21', T22' in the memory cell MC12 by via structures 1213, 1214, 1217, 1218. The word line WL3 is electrically coupled to the gates of the corresponding transistors in the memory cells MC21, MC22 by via structures 1221, 1222, 1225, 1226. The word line WL4 is electrically coupled to the gates of the corresponding transistors in the memory cells MC21, MC22 by via structures 1223, 1224, 1227, 1228.

In the semiconductor device 1200A, the memory cells MC11, MC12 are separated from each other along the X axis by an isolation structure 1202. The isolation structure 1202 also separates the memory cells MC21, MC22 from each other along the X axis. The portion of the semiconductor device 1200A on the left side of the isolation structure 1202 includes the memory cells MC11, MC21 and corresponds to the semiconductor device 700. The portion of the semiconductor device 1200A on the right side of the isolation structure 1202 includes the memory cells MC12, MC22 and also corresponds to the semiconductor device 700.

A difference between the memory device 1100 and the semiconductor device 1200A is as follows. In the memory device 1100, the memory cell MC11 and the memory cell MC12 share the same conductor S12 which creates a path for sneak current in some situations, as described with respect to FIG. 11. In the semiconductor device 1200A, the memory cell MC11 and the memory cell MC12 do not share the same conductor S12. Instead, the memory cell MC12 has a separated conductor S12' which is electrically coupled to the source line SL1 and performs for the memory cell MC12 the same functions as those performed by the conductor S11 for the memory cell MC11. Because the memory cells MC11, MC12 in the semiconductor device 1200A do not share the same conductor S12, a path for sneak current is eliminated and concerns related to sneak current are addressed in one or more embodiments. Similarly, the memory cells MC21, MC22 in the semiconductor device 1200A do not share the same conductor S22 due to the isolation structure 1202, thereby eliminating a path for sneak current. In at least one embodiment, one or more other advantages described herein are achievable in the semiconductor device 1200A.

Figure 12B:
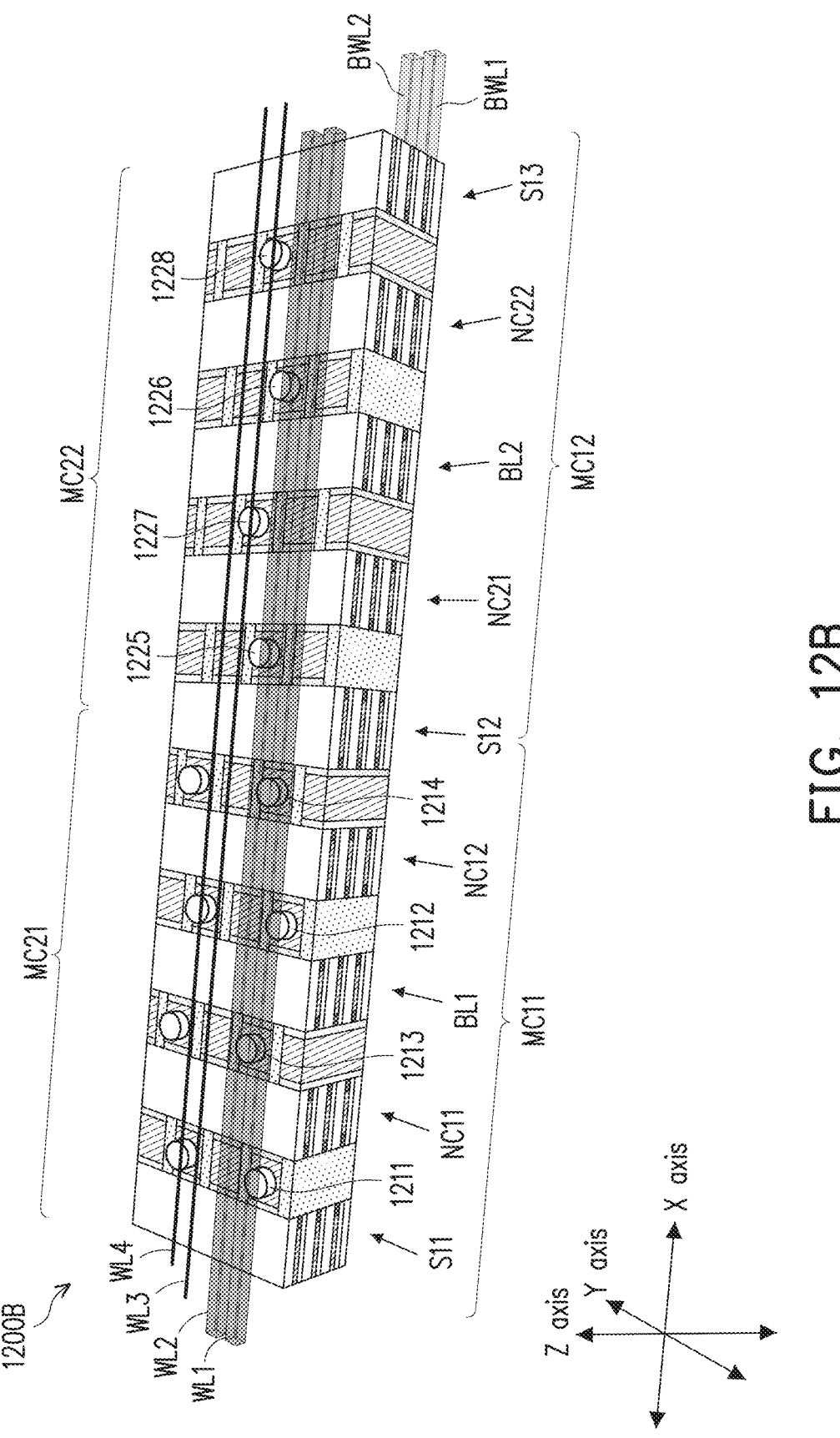
FIG. 12B is a schematic perspective view of a semiconductor device, in accordance with some embodiments.

FIG. 12B is a schematic perspective view of a semiconductor device 1200B, in accordance with some embodiments. In at least one embodiment, the semiconductor device 1200B corresponds to a portion of the memory device 1100. Corresponding elements in FIGS. 11, 12A and 12B are designated by the same reference numerals.

In the semiconductor device 1200B, similarly to the memory device 1100, the memory cells MC11, MC12 share the same conductor S12, and the memory cells MC21, MC22 share the same conductor S22. In other words, the isolation structure 1202 is not included in the semiconductor device 1200B between adjacent memory cells along the X axis.

The semiconductor device 1200B comprises a separate set of bottom word lines BWL1, BWL2 electrically coupled to the corresponding transistors in the memory cell MC12. In at least one embodiment, the arrangement of the bottom word lines BWL1, BWL2 under the corresponding gate stacks in the memory cell MC12 is as described with respect to FIG. 8F. The bottom word lines BWL1, BWL2 are not electrically coupled to the transistors of the memory cell MC11, but are electrically coupled to the transistors of a memory cell (not shown) on the other side of the memory cell MC11. The word lines WL1, WL2 are electrically coupled to the transistors of the memory cell MC11 as described with respect to FIG. 12A, but are not electrically coupled to the transistors of the memory cell MC12. The word lines WL1, WL2 are electrically coupled to the transistors of the memory cell MC13 (shown in FIG. 11). In other words, the set of word lines WL1, WL2 and the set of bottom word lines BWL1, BWL2 are alternatingly electrically coupled to the transistors of memory cells adjacent along the X axis. The set of word lines WL1, WL2 and the set of bottom word lines BWL1, BWL2 are addressed separately, i.e., a turn-ON voltage applied to the set of word lines WL1, WL2 is not applied at the same time to the set of bottom word lines BWL1, BWL2, and vice versa. As a result, during a read operation of the memory cell MC11, the transistors in the memory cell MC12 are not turned ON, thereby eliminating a path for sneak current through the memory cell MC12 and addressing concerns related to sneak current in one or more embodiments. Similarly, the memory cells MC21, MC22 are coupled to separate sets of word lines. In the example configuration in FIG. 12B, the transistors of the memory cell MC22 are coupled to the word lines WL3, WL4 as described with respect to FIG. 12A. The word lines WL3, WL4 are not electrically coupled to the transistors of the memory cell MC21. Instead, the transistors of the memory cell MC21 are electrically coupled to a separate set of bottom word lines (not shown), thereby eliminating a path for sneak current. In at least one embodiment, one or more other advantages described herein are achievable in the semiconductor device 1200B.

Figure 13:
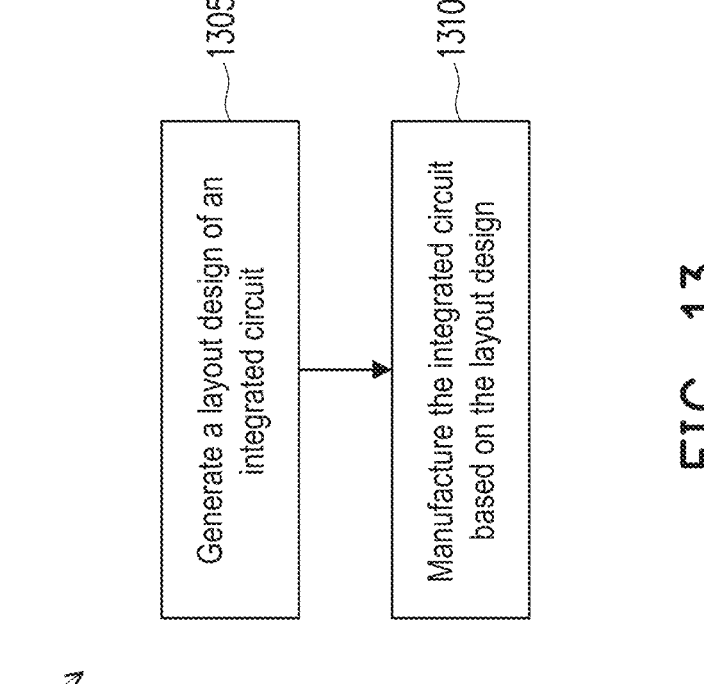
FIG. 13 is a flow chart of a method, in accordance with some embodiments.

FIG. 13 is a flowchart of a method 1300, in accordance with some embodiments. It is understood that additional operations may be performed before, during, and/or after the method 1300 depicted in FIG. 13, and that some other operations may only be briefly described herein. In some embodiments, the method 1300 is usable to form integrated circuit devices, such as one or more of memory devices 100, 500, 1100, and semiconductor devices 600, 700, 800, 800F, 900, 1000, 1200A, 1200B.

At operation 1305, a layout design (also referred to herein as "layout diagram") of an integrated circuit device is generated. Operation 1305 is performed by a processing device (e.g., a processor as described herein) configured to execute instructions for generating a layout design. In some embodiments, the layout design includes one or more patterns corresponding to features of one or more of memory cells 200, 300, memory devices 100, 500, 1100, and semiconductor devices 600, 700, 800, 800F, 900, 1000, 1200A, 1200B. In some embodiments, the layout design is in a graphic database system (GDSII) file format.

At operation 1310, an integrated circuit device is manufactured based on the layout design. In some embodiments, operation 1310 comprises manufacturing at least one mask based on the layout design, and manufacturing the integrated circuit device based on the at least one mask. In at least one embodiment, one or more advantages described herein are achievable in an IC device manufactured by the method 1300.

FIG. 14 is a flowchart of a method 1400, in accordance with some embodiments. In at least one embodiment, the method 1400 is for generating a layout diagram for a memory cell a memory device. In some embodiments, method 1400 is an embodiment of operation 1305 of method 1300. In some embodiments, one or more operations of the method 1400 are performed as part of a method of forming one or more memory devices and/or IC devices described herein. In some embodiments, one or more operations of the method 1400 are performed by an APR system, as described herein. In some embodiments, one or more operations of the method 1400 are performed as part of a design procedure performed in a design house as described herein. In some embodiments, one or more operations of the method 1400 are executed by a processor, such as a processor of an EDA system described herein. In some embodiments, one or more operations in the method 1400 described herein are omitted.

The memory element 1400 starts, in one or more embodiments, from a layout diagram having therein at least first through fourth memory elements arranged in a memory array with rows elongated along a first axis, e.g., the X axis, and columns elongated along a second axis, e.g., the Y axis. An example memory array is described with respect to FIGS. 5-6, and comprises transistors T11, T12, T21, T22.

At operation 1405, a set of first and second word lines elongated along the X axis is arranged to electrically couple the first word line to control terminals of the first and second memory elements, and the second word line to control terminals of the third and fourth memory elements. For example, as described with respect to FIGS. 5-6, the gates of the transistors T11, T12 are arranged to be electrically coupled to the word line WL1, and the gates of the transistors T21, T22 are arranged to be electrically coupled to the word line WL2. In some embodiments, arranging word lines comprises arranging the word lines over the memory elements and generating via structures for electrical connections to the memory elements, as described with respect to FIG. 6. In some embodiments, arranging word lines comprises arranging the word lines under the memory elements, as described with respect to FIGS. 8F, 9. In some embodiments, arranging word lines comprises arranging some word lines under, and other word lines over, the memory elements, as described with respect to FIG. 12B.

At operation 1410, a bit line and a set of first and second auxiliary lines, all elongated along the Y axis, are arranged to be electrically coupled to the first through fourth memory elements. For example, as described with respect to FIGS. 5-6, the transistor T11 is arranged to be electrically coupled between the bit line BL1 and the auxiliary line NC11, the transistor T12 is arranged to have a source/drain electrically coupled to the auxiliary line NC12, the transistor T21 is arranged to have a source/drain electrically coupled to the auxiliary line NC11, and the transistor T22 is arranged to be electrically coupled between the bit line BL1 and the auxiliary line NC12. In some embodiments, arranging a bit line and auxiliary lines comprises extending certain source/drains of certain transistors continuously along the Y axis, as described with respect to FIGS. 5-6.

At operation 1415, a source line elongated along the X axis is arranged to be electrically coupled to the second and third memory elements. For example, as described with respect to FIGS. 5-6, the source line SL1 is arranged to be electrically coupled to the other source/drain of each of the transistors T12, T21. As a result, the transistor T12 is arranged to be electrically coupled between the source line SL1 and the auxiliary line NC12, and the transistor T21 is arranged to be electrically coupled between the source line SL1 and the auxiliary line NC11. In some embodiments, arranging a source line comprises arranging the source line over the memory elements and generating via structures for electrical connections to the memory elements, as described with respect to FIGS. 5-6. As a result, a layout diagram of a memory cell is obtained.

At operation 1420, the generated layout diagram of the memory cell is stored in a standard cell library on a non-transitory computer-readable medium.

At operation 1425, the generated layout diagram of the memory cell is read from the standard cell library and repeatedly placed in abutment to generate a layout diagram of a memory device. Based on the generated layout diagram, at least one of a semiconductor mask or a component in a layer of a memory device is fabricated, for example, as described with respect to FIG. 15. In at least one embodiment, operation 1425 is omitted. In at least one embodiment, one or more advantages described herein are achievable in an IC device manufactured based on the layout diagram generated by the method 1400.

In at least one embodiment, one or more or all operations of the method 1400 are automatically performed, e.g., by a processor as described herein, without user input or intervention.

FIG. 15 is a flowchart of a method 1500, in accordance with some embodiments. In at least one embodiment, the method 1500 is for manufacturing a semiconductor device, such as a memory device. In some embodiments, method 1500 is an embodiment of operation 1310 of method 1300. In some embodiments, one or more operations of the method 1500 are performed as part of a method of forming one or more memory devices and/or IC devices described herein. In some embodiments, one or more operations in the method 1500 described herein are omitted.

At operation 1505, a memory array having at least first through fourth memory elements is formed, for example, as described with respect to FIGS. 10A-10G. An example memory array is described with respect to FIGS. 5-6, and comprises transistors T11, T12, T21, T22.

At operation 1510, a set of first and second word lines elongated along the X axis is formed. The first word line is electrically coupled to control terminals of the first and second memory elements, and the second word line is electrically coupled to control terminals of the third and fourth memory elements. For example, as described with respect to FIGS. 5-6, the gates of the transistors T11, T12 are electrically coupled to the word line WL1, and the gates of the transistors T21, T22 are electrically coupled to the word line WL2. In some embodiments, the word lines are formed over the memory elements and are electrically coupled by via structures to the memory elements, as described with respect to FIG. 6. In this aspect, the word lines are formed after the formation of the memory array. In some embodiments, the word lines are formed under the memory elements, as described with respect to FIGS. 8F, 9. In this aspect, the word lines are formed as bottom word lines before the formation of the memory array. In some embodiments, some word lines are formed under, and other word lines over, the memory elements, as described with respect to FIG. 12A. In this aspect, the word lines are formed both before and after the formation of the memory array.

At operation 1515, a bit line and a set of first and second auxiliary lines, all elongated along the Y axis, are formed and electrically coupled to the first through fourth memory elements. For example, as described with respect to FIGS. 5-6, the transistor T11 is electrically coupled between the bit line BL1 and the auxiliary line NC11, the transistor T12 has a source/drain electrically coupled to the auxiliary line NC12, the transistor T21 has a source/drain electrically coupled to the auxiliary line NC11, and the transistor T22 is electrically coupled between the bit line BL1 and the auxiliary line NC12. In some embodiments, the bit line and auxiliary lines are formed during the formation of the memory array, by extending certain source/drains of certain transistors continuously along the Y axis, as described with respect to FIGS. 5-6.

At operation 1520, a source line elongated along the X axis is formed and electrically coupled to the second and third memory elements. For example, as described with respect to FIGS. 5-6, the source line SL1 is formed and electrically coupled to the other source/drain of each of the transistors T12, T21. As a result, the transistor T12 is electrically coupled between the source line SL1 and the auxiliary line NC12, and the transistor T21 is electrically coupled between the source line SL1 and the auxiliary line NC11. In some embodiments, the source line is formed after the formation of the memory array by forming the source line over the memory elements and forming via structures for electrical connections to the memory elements, as described with respect to FIGS. 5-6.

In some embodiments, the method 1500 further comprises one or more of forming a stepwise structure for electrically coupling the bit lines and auxiliary lines to other circuitry as described with respect to FIG. 10H, or forming an isolation structure separating memory cells adjacent along the X axis as described with respect to FIG. 11A. In at least one embodiment, one or more other advantages described herein are achievable in an IC device manufactured by the method 1500.

In some embodiments, one or more cells, IC devices, and methods described are applicable to various types of transistor or device technologies including, but not limited to, planar transistor technology, FINFET technology, nanosheet FET technology, nanowire FET technology, or the like.

Figure 16:
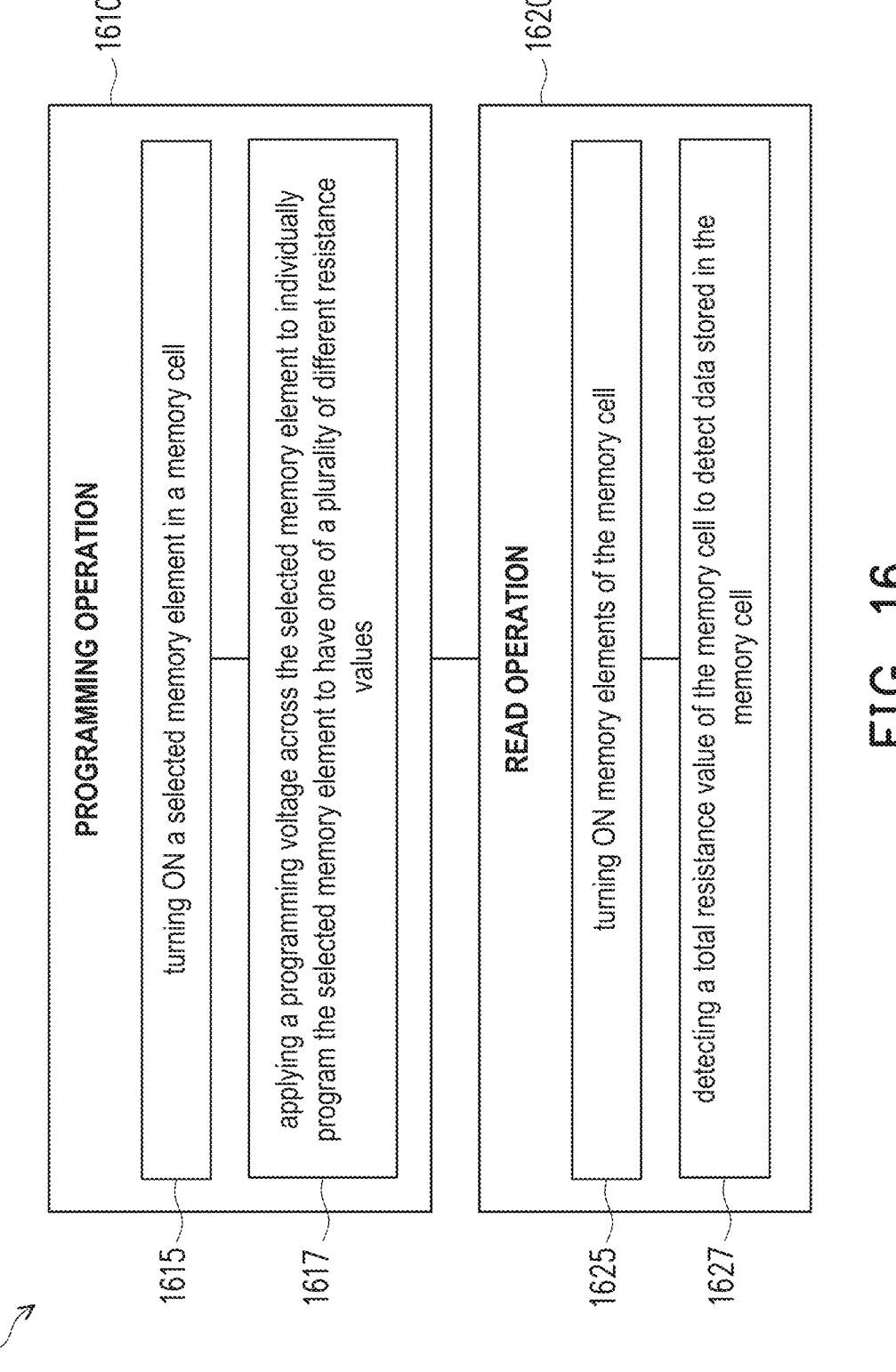
FIG. 16 is a flow chart of a method, in accordance with some embodiments.

FIG. 16 is a flow chart of a method 1600, in accordance with some embodiments. In at least one embodiment, the method 1600 is a method of operating a memory cell. Example memory cells are described with respect to FIGS. 2-3.

The method 1600 comprises a programming operation 1610, which comprises operation 1615 and operation 1617.

At operation 1615, a selected memory element in the memory cell is turned ON. For example, a turn-ON voltage is applied to a word line coupled to the selected memory element to turn ON the selected memory element, as described with respect to one or more of FIGS. 2, 3.

At operation 1617, a programming voltage is applied across the selected memory element, which is turned ON, to individually program the selected memory element to have one of a plurality of different resistance values. For example, a program voltage is applied to a pair of a bit line and an auxiliary line, or a pair of a source line and an auxiliary line, or a pair of two auxiliary lines which are electrically coupled to the selected memory element. As a result, it is possible to individually program the memory element without disturbing other unselected memory elements in the memory cell. Example programming operations are described with respect to one or more of FIGS. 2, 3. The programmed memory element has one among several different resistance values, and it is possible to program the memory cell to have different total resistance values depending on the resistance values of memory elements in the memory cell MC, for example, as described with respect to FIGS. 4A-4B. The different total resistance values correspond to different data stored in the memory cell.

The method 1600 further comprises a read operation 1620, which comprises operation 1625 and operation 1627.

At operation 1625, the memory elements in the memory cell MC are turned ON. For example, a turn-ON voltage is applied to the word lines coupled to the gates or control terminals of the memory elements in the memory cell MC.

At operation 1627, a total resistance value of the memory cell is detected to thereby detect the data stored in the memory cell. For example, a read voltage is applied across the bit line and source line to which the memory cell is electrically coupled. The read voltage causes a read current corresponding to the total resistance value of the memory cell to occur. A controller detects the read current and determine the total resistance value of the memory cell as well as the data stored therein. Example read operations are described with respect to FIGS. 2, 3, 11.

In some embodiments, the method 1600 further comprises performing in-memory computation, for example, as described with respect to FIG. 1. In at least one embodiment, the read operation 1620 is performed without causing sneak current in or through adjacent memory cell, as described with respect to one or more of FIGS. 12A, 12B.

Figure 17:
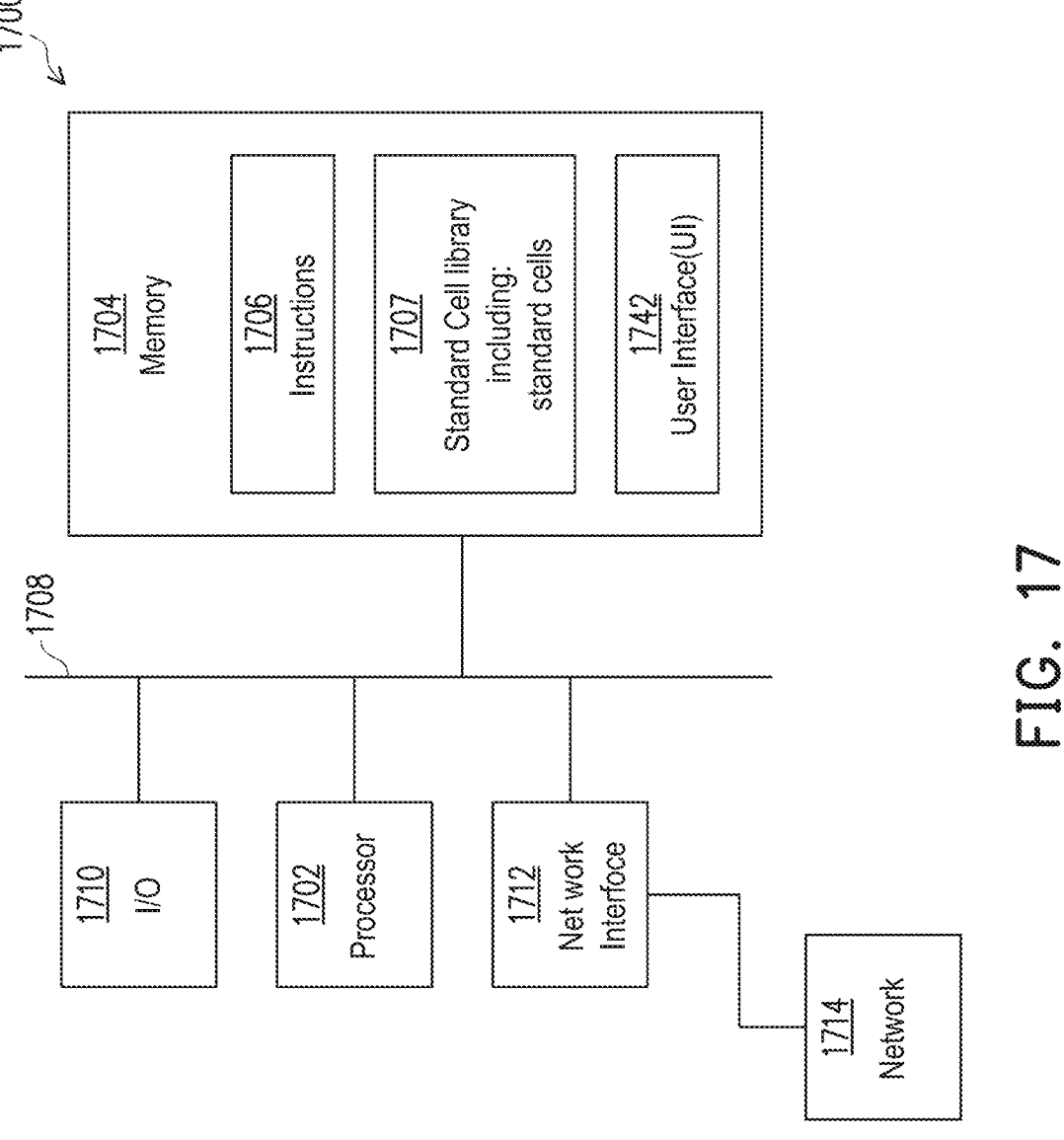
FIG. 17 is a block diagram of an EDA system, in accordance with some embodiments.

FIG. 17 is a block diagram of an electronic design automation (EDA) system 1700 in accordance with some embodiments.

In some embodiments, EDA system 1700 includes an APR system. Methods described herein of designing layout diagrams represent wire routing arrangements, in accordance with one or more embodiments, are implementable, for example, using EDA system 1700, in accordance with some embodiments.

In some embodiments, EDA system 1700 is a general purpose computing device including a hardware processor 1702 and a non-transitory, computer-readable storage medium 1704. Storage medium 1704, amongst other things, is encoded with, i.e., stores, computer program code 1706, i.e., a set of executable instructions. Execution of instructions 1706 by hardware processor 1702 represents (at least in part) an EDA tool which implements a portion or all of the methods described herein in accordance with one or more embodiments (hereinafter, the noted processes and/or methods).

Processor 1702 is electrically coupled to computer-readable storage medium 1704 via a bus 1708. Processor 1702 is also electrically coupled to an I/O interface 1710 by bus 1708. A network interface 1712 is also electrically connected to processor 1702 via bus 1708. Network interface 1712 is connected to a network 1714, so that processor 1702 and computer-readable storage medium 1704 are capable of connecting to external elements via network 1714. Processor 1702 is configured to execute computer program code 1706 encoded in computer-readable storage medium 1704 in order to cause system 1700 to be usable for performing a portion or all of the noted processes and/or methods. In one or more embodiments, processor 1702 is a central processing unit (CPU), a multi-processor, a distributed processing system, an application specific integrated circuit (ASIC), and/or a suitable processing unit.

In one or more embodiments, computer-readable storage medium 1704 is an electronic, magnetic, optical, electromagnetic, infrared, and/or a semiconductor system (or apparatus or device). For example, computer-readable storage medium 1704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1704 includes a compact disk-read only memory (CD-ROM), a compact disk-read/write (CD-R/W), and/or a digital video disc (DVD).

In one or more embodiments, storage medium 1704 stores computer program code 1706 configured to cause system 1700 (where such execution represents (at least in part) the EDA tool) to be usable for performing a portion or all of the noted processes and/or methods. In one or more embodiments, storage medium 1704 also stores information which facilitates performing a portion or all of the noted processes and/or methods. In one or more embodiments, storage medium 1704 stores library 1707 of standard cells including such standard cells as disclosed herein.

EDA system 1700 includes I/O interface 1710. I/O interface 1710 is coupled to external circuitry. In one or more embodiments, I/O interface 1710 includes a keyboard, keypad, mouse, trackball, trackpad, touchscreen, and/or cursor direction keys for communicating information and commands to processor 1702.

EDA system 1700 also includes network interface 1712 coupled to processor 1702. Network interface 1712 allows system 1700 to communicate with network 1714, to which one or more other computer systems are connected. Network interface 1712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1700.

System 1700 is configured to receive information through I/O interface 1710. The information received through I/O interface 1710 includes one or more of instructions, data, design rules, libraries of standard cells, and/or other parameters for processing by processor 1702. The information is transferred to processor 1702 via bus 1708. EDA system 1700 is configured to receive information related to a UI through I/O interface 1710. The information is stored in computer-readable medium 1704 as user interface (UI) 1742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1700. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 18:
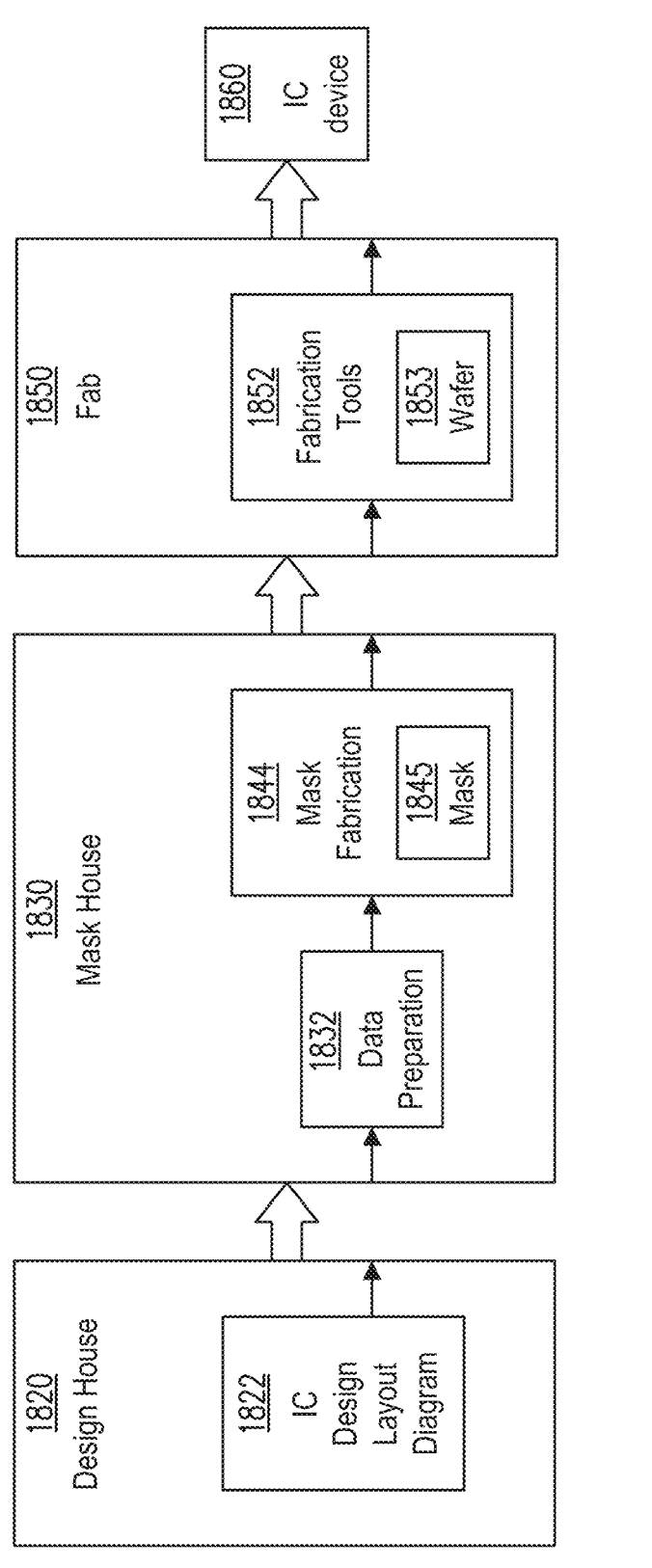
FIG. 18 is a block diagram of an IC manufacturing system and an IC manufacturing flow associated therewith, in accordance with some embodiments.

FIG. 18 is a block diagram of an integrated circuit (IC) manufacturing system 1800, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1800.

In FIG. 18, IC manufacturing system 1800 includes entities, such as a design house 1820, a mask house 1830, and an IC manufacturer/fabricator ("fab") 1850, that interact with one another in the design, development, and manufacturing cycles and/or services related to manufacturing an IC device 1860. The entities in system 1800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1820, mask house 1830, and IC fab 1850 is owned by a single larger company. In some embodiments, two or more of design house 1820, mask house 1830, and IC fab 1850 coexist in a common facility and use common resources.

Design house (or design team) 1820 generates an IC design layout diagram 1822. IC design layout diagram 1822 includes various geometrical patterns designed for an IC device 1860. The geometrical patterns correspond to patterns of metal, oxide, or semiconductor layers that make up the various components of IC device 1860 to be fabricated. The various layers combine to form various IC features. For example, a portion of IC design layout diagram 1822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1820 implements a proper design procedure to form IC design layout diagram 1822. The design procedure includes one or more of logic design, physical design or place-and-route operation. IC design layout diagram 1822 is presented in one or more data files having information of the geometrical patterns. For example, IC design layout diagram 1822 can be expressed in a GDSII file format or DFII file format.

Mask house 1830 includes data preparation 1832 and mask fabrication 1844. Mask house 1830 uses IC design layout diagram 1822 to manufacture one or more masks 1845 to be used for fabricating the various layers of IC device 1860 according to IC design layout diagram 1822. Mask house 1830 performs mask data preparation 1832, where IC design layout diagram 1822 is translated into a representative data file ("RDF"). Mask data preparation 1832 provides the RDF to mask fabrication 1844. Mask fabrication 1844 includes a mask writer. A mask writer converts the RDF to an image on a substrate, such as a mask (reticle) 1845 or a semiconductor wafer 1853. The design layout diagram 1822 is manipulated by mask data preparation 1832 to comply with particular characteristics of the mask writer and/or requirements of IC fab 1850. In FIG. 18, mask data preparation 1832 and mask fabrication 1844 are illustrated as separate elements. In some embodiments, mask data preparation 1832 and mask fabrication 1844 can be collectively referred to as mask data preparation.

In some embodiments, mask data preparation 1832 includes optical proximity correction (OPC) which uses lithography enhancement techniques to compensate for image errors, such as those that can arise from diffraction, interference, other process effects and the like. OPC adjusts IC design layout diagram 1822. In some embodiments, mask data preparation 1832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1832 includes a mask rule checker (MRC) that checks the IC design layout diagram 1822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1822 to compensate for limitations during mask fabrication 1844, which may undo part of the modifications performed by OPC in order to meet mask creation rules.

In some embodiments, mask data preparation 1832 includes lithography process checking (LPC) that simulates processing that will be implemented by IC fab 1850 to fabricate IC device 1860. LPC simulates this processing based on IC design layout diagram 1822 to create a simulated manufactured device, such as IC device 1860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1822.

It should be understood that the above description of mask data preparation 1832 has been simplified for the purposes of clarity. In some embodiments, data preparation 1832 includes additional features such as a logic operation (LOP) to modify the IC design layout diagram 1822 according to manufacturing rules. Additionally, the processes applied to IC design layout diagram 1822 during data preparation 1832 may be executed in a variety of different orders.

After mask data preparation 1832 and during mask fabrication 1844, a mask 1845 or a group of masks 1845 are fabricated based on the modified IC design layout diagram 1822. In some embodiments, mask fabrication 1844 includes performing one or more lithographic exposures based on IC design layout diagram 1822. In some embodiments, an electron-beam (e-beam) or a mechanism of multiple e-beams is used to form a pattern on a mask (photomask or reticle) 1845 based on the modified IC design layout diagram 1822. Mask 1845 can be formed in various technologies. In some embodiments, mask 1845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1845 includes a transparent substrate (e.g., fused quartz) and an opaque material (e.g., chromium) coated in the opaque regions of the binary mask. In another example, mask 1845 is formed using a phase shift technology. In a phase shift mask (PSM) version of mask 1845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1844 is used in a variety of processes. For example, such a mask(s) is used in an ion implantation process to form various doped regions in semiconductor wafer 1853, in an etching process to form various etching regions in semiconductor wafer 1853, and/or in other suitable processes.

IC fab 1850 is an IC fabrication business that includes one or more manufacturing facilities for the fabrication of a variety of different IC products. In some embodiments, IC Fab 1850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1850 includes fabrication tools 1852 configured to execute various manufacturing operations on semiconductor wafer 1853 such that IC device 1860 is fabricated in accordance with the mask(s), e.g., mask 1845. In various embodiments, fabrication tools 1852 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1850 uses mask(s) 1845 fabricated by mask house 1830 to fabricate IC device 1860. Thus, IC fab 1850 at least indirectly uses IC design layout diagram 1822 to fabricate IC device 1860. In some embodiments, semiconductor wafer 1853 is fabricated by IC fab 1850 using mask(s) 1845 to form IC device 1860. In some embodiments, the IC fabrication includes performing one or more lithographic exposures based at least indirectly on IC design layout diagram 1822. Semiconductor wafer 1853 includes a silicon substrate or other proper substrate having material layers formed thereon. Semiconductor wafer 1853 further includes one or more of various doped regions, dielectric features, multilevel interconnects, and the like (formed at subsequent manufacturing steps).

Details regarding an integrated circuit (IC) manufacturing system (e.g., system 1800 of FIG. 18), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, an integrated circuit (IC) device comprises a plurality of memory cells each comprising first through fourth memory elements. The first memory element is physically arranged, along a first axis, between a bit line and a first auxiliary conductive line. The second memory element is physically arranged, along the first axis, between a second auxiliary conductive line and a first conductor. The first memory element and the second memory element are arranged in a first row along the first axis. The third memory element is physically arranged, along the first axis, between the first auxiliary conductive line and a second conductor electrically coupled to the first conductor. The fourth memory element is physically arranged, along the first axis, between the bit line and the second auxiliary conductive line. The third memory element and the fourth memory element are arranged in a second row along the first axis. The first row is spaced from the second row along a second axis transverse to the first axis.

In some embodiments, an integrated circuit (IC) device comprises a substrate, and a memory array layer over the substrate. The memory array layer comprises a plurality of memory cells each comprising a set of memory elements. The plurality of memory cells comprises a first memory cell, and a second memory cell adjacent the first memory cell along a first axis. The set of memory elements of the first memory cell and the set of memory elements of the second memory cell are electrically coupled to a same set of word lines, a same source line, and corresponding first and second bit lines. The IC device further comprises, in the memory array layer and along the first axis, an isolation structure between the first memory cell and the second memory cell.

In some embodiments, a method comprises patterning a multilayer structure comprising at least one memory array layer, to obtain an opening between a first portion and a second portion of the multilayer structure, and at least one channel extending across the opening from the first portion to the second portion. The at least one channel belongs to at least one active region layer in the at least one memory array layer. The method further comprises depositing a memory film around the at least one channel, depositing a conductive material in the opening, and patterning the deposited conductive material to obtain at least one gate electrode around the at least one channel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) device, comprising:
a plurality of memory cells each comprising:
  a first memory element which is physically arranged, along a first axis, between a bit line and a first auxiliary conductive line,
  a second memory element which is physically arranged, along the first axis, between a second auxiliary conductive line and a first conductor, the first memory element and the second memory element arranged in a first row along the first axis,
  a third memory element which is physically arranged, along the first axis, between the first auxiliary conductive line and a second conductor, the first conductor electrically coupled to the second conductor, and
  a fourth memory element which is physically arranged, along the first axis, between the bit line and the second auxiliary conductive line, the third memory element and the fourth memory element arranged in a second row along the first axis, the first row spaced from the second row along a second axis transverse to the first axis.

2. The IC device of claim 1, wherein in each of the plurality of memory cells,
  each of the first through fourth memory elements is individually programmable to have different resistances.

3. The IC device of claim 1, further comprising:
a first word line along the first row, and electrically coupled to the first memory element and the second memory element; and
a second word line along the second row, and electrically coupled to the third memory element and the fourth memory element.

4. The IC device of claim 1, wherein
in each of the plurality of memory cells and along the first
  axis,
    the bit line is physically arranged between the first
      auxiliary conductive line and the second auxiliary
      conductive line,
    the first memory element is physically arranged
      between the third memory element and the fourth
      memory element, and
    the fourth memory element is physically arranged
      between the first memory element and the second
      memory element.

5. The IC device of claim 1, wherein
in each of the plurality of memory cells and along the first
  axis,
    the bit line, the first auxiliary conductive line and the
      second auxiliary conductive line are physically
      arranged between a first via structure and a second
      via structure at which a source line is electrically
      coupled to the first conductor and the second con-
      ductor.

6. The IC device of claim 1, wherein
the plurality of memory cells comprises a first memory
  cell and a second memory cell adjacent each other
  along the first axis, and
the IC device further comprises an isolation structure
  physically between the first memory cell and the sec-
  ond memory cell along the first axis.

7. The IC device of claim 6, wherein
the isolation structure is physically between the first
  conductor of the first memory cell and the second
  conductor of the second memory cell.

8. The IC device of claim 7, further comprising:
a source line electrically coupled to
    the first conductor and the second conductor of the first
      memory cell, and
    the first conductor and the second conductor of the
      second memory cell.

9. The IC device of claim 1, wherein
the plurality of memory cells comprises a first memory
  cell and a second memory cell adjacent each other
  along the first axis, and
the IC device further comprises:
    at least one top word line physically arranged over the
      first memory cell and the second memory cell, and
      electrically coupled to the first memory cell without
      being electrically coupled to the second memory
      cell.

10. The IC device of claim 9, wherein
the at least one top word line comprises:
    a first top word line along the first row, and electrically
      coupled to the first memory element and the second
      memory element of the first memory cell, and
    a second top word line along the second row, and
      electrically coupled to the third memory element and
      the fourth memory element of the first memory cell.

11. The IC device of claim 9, wherein
the IC device further comprises:
    at least one bottom word line physically arranged under
      the first memory cell and the second memory cell,
      and electrically coupled to the second memory cell
      without being electrically coupled to the first
      memory cell.

12. The IC device of claim 11, wherein
the at least one top word line comprises:
    a first top word line along the first row, and electrically
      coupled to the first memory element and the second
      memory element of the first memory cell, and
    a second top word line along the second row, and
      electrically coupled to the third memory element and
      the fourth memory element of the first memory cell,
      and
the at least one bottom word line comprises:
    a first bottom word line along the first row, and elec-
      trically coupled to the first memory element and the
      second memory element of the second memory cell,
      and
    a second bottom word line along the second row, and
      electrically coupled to the third memory element and
      the fourth memory element of the second memory
      cell.

13. The IC device of claim 1, wherein
the plurality of memory cells is arranged in a plurality of
  memory layers stacked one upon another.

14. An integrated circuit (IC) device, comprising:
a substrate; and
a memory array layer over the substrate, the memory
  array layer comprising a plurality of memory cells each
  comprising a set of memory elements, wherein
the plurality of memory cells comprises a first memory
  cell, and a second memory cell adjacent the first
  memory cell along a first axis,
the set of memory elements of the first memory cell and
  the set of memory elements of the second memory cell
  are electrically coupled to
    a same set of word lines,
    a same source line, and
    corresponding first and second bit lines, and
the IC device further comprises, in the memory array
  layer and along the first axis, an isolation structure
  between the first memory cell and the second memory
  cell.

15. The IC device of claim 14, wherein
the first memory cell comprises a first conductor coupled
  to the source line,
the second memory cell comprises a second conductor
  coupled to the source line, and
the isolation structure is physically between the first
  conductor and the second conductor along the first axis.

16. A method, comprising:
patterning a multilayer structure comprising at least one
  memory array layer, to obtain
    an opening between a first portion and a second portion
      of the multilayer structure, and
    at least one channel extending across the opening from
      the first portion to the second portion, the at least one
      channel belonging to at least one active region layer
      in the at least one memory array layer;
depositing a memory film around the at least one channel;
depositing a conductive material in the opening; and
patterning the deposited conductive material to obtain at
  least one gate electrode around at least one channel.

17. The method of claim 16, wherein
the at least one memory array layer comprises a plurality
  of memory array layers stacked one over another.

18. The method of claim 17, further comprising:
patterning the multilayer structure to form a stepwise
  structure comprising a plurality of steps each contain-
  ing source/drain contacts in a corresponding one of the
  plurality of memory array layers.

19. The method of claim 17, wherein the at least one gate electrode comprises a plurality of gate electrodes, the at least one channel comprises a plurality of channel stacks in each of which multiple channels, each belonging to a corresponding memory array layer among the plurality of memory array layers, are stacked over and spaced from each other, and for each channel stack among the plurality of channel stacks, the deposited memory film comprises multiple separate portions each extending around a corresponding one of the multiple channels in the channel stack, and a corresponding gate electrode among the plurality of gate electrodes obtained by said patterning the deposited conductive material extends around the multiple separate portions of the memory film.

20. The method of claim 16, wherein the at least one gate electrode comprises a plurality of gate electrodes, the method further comprising:

depositing an insulating material between adjacent gate electrodes among the plurality of gate electrodes.

\* \* \* \* \*